(12) United States Patent
Chandrasekaran et al.

(10) Patent No.: US 12,150,391 B2
(45) Date of Patent: Nov. 19, 2024

(54) METAL OXIDE LINER FOR CROSS-POINT PHASE CHANGE MEMORY CELL

(71) Applicant: Intel Corporation, Santa Clara, CA (US)

(72) Inventors: Hari Chandrasekaran, Portland, OR (US); Rajesh Venkatasubramanian, Albuquerque, NM (US); Hoi-Sung Chung, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 906 days.

(21) Appl. No.: 17/033,271

(22) Filed: Sep. 25, 2020

(65) Prior Publication Data

US 2022/0102625 A1   Mar. 31, 2022

(51) Int. Cl.
*H10N 70/20*     (2023.01)
*H10B 63/00*     (2023.01)
*H10N 70/00*     (2023.01)

(52) U.S. Cl.
CPC ........... *H10N 70/231* (2023.02); *H10B 63/30* (2023.02); *H10N 70/063* (2023.02); *H10N 70/841* (2023.02); *H10N 70/882* (2023.02); *H10N 70/8833* (2023.02)

(58) Field of Classification Search
CPC .. H10N 70/231; H10N 70/063; H10N 70/841; H10N 70/882; H10N 70/8833; H10B 63/30
See application file for complete search history.

(56) References Cited

U.S. PATENT DOCUMENTS

| | | | |
|---|---|---|---|
| 2005/0056899 A1* | 3/2005 | Rendon | H01L 29/66492 257/E29.267 |
| 2019/0036014 A1* | 1/2019 | Ha | H10N 50/01 |
| 2020/0066988 A1* | 2/2020 | Lee | H01L 21/02417 |

\* cited by examiner

*Primary Examiner* — David Vu
(74) *Attorney, Agent, or Firm* — Essential Patents Group, LLP

(57) ABSTRACT

Phase change memory material stacks having a metal oxide liner for memory integrated circuits, related systems, and methods of fabrication are disclosed. Such phase change memory material stacks include a phase change material and a switching device and the sidewalls of the phase change memory material stacks are lined with a metal oxide to protect the material stacks during manufacture and use and to provide isolation between the material stacks.

20 Claims, 15 Drawing Sheets

METAL OXIDE LINER FOR CROSS-POINT PHASE CHANGE MEMORY CELL

BACKGROUND

In computer systems including mobile computing platforms and communication devices, memory or storage device are important components for system performance. For example, one or more central processors and other processors may communicate with one or more memory devices such that the central processor executes and operating system and other software applications, the other processors implement software and dedicated hardware functions, and the processors read and write data from the memory devices. A non-volatile memory device may include a 3-dimensional cross-point (3DX) phase change memory (PCM) device including memory cells accessible via access lines with the memory cells and access lines stacked for improved density. Such memory cells act as variable resistors such that when a sensing potential applied across the memory cell, a resistance is measured and, depending on the measured resistance, a memory state (e.g., one or zero) is determined. The memory state is varied by applying different potentials that vary the phase of the memory cell.

In the context of such 3DXP PCM memory devices, there is an ongoing need for improved device performance and manufacturing. Notably, current manufacturing techniques can cause one or more materials in the memory cell to oxidize, which reduces the active area of the device causing decreased performance and, in some examples, poor manufacturing yields.

It is with respect to these and other considerations that the present improvements have been needed. Such improvements may become critical as the desire for compact and high speed non-volatile memory devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
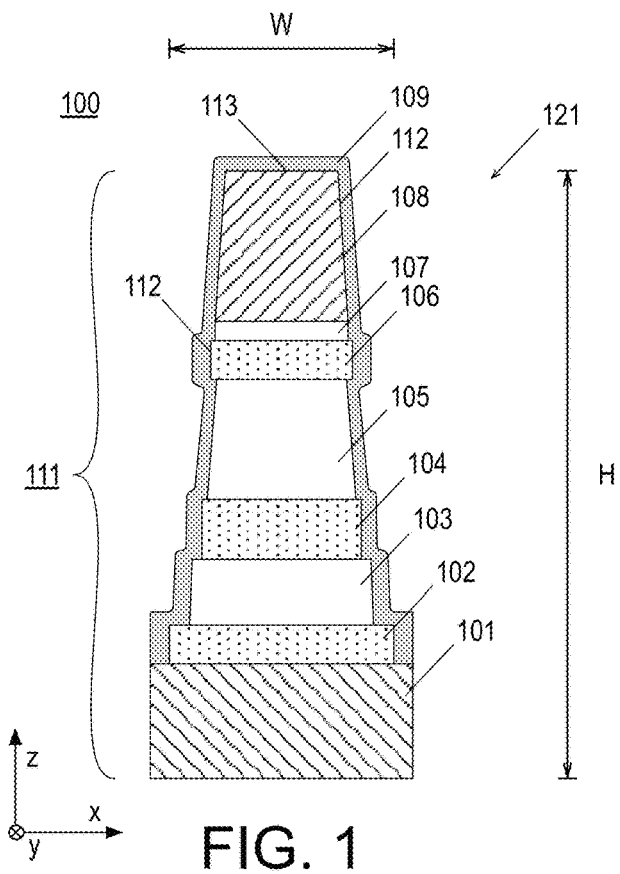
FIG. 1 is an illustration of a cross-sectional view of a phase change memory structure including a metal oxide liner.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Phase change memory structures, memory device structures, systems, computing platforms, and methods are described herein related to 3-dimensinoal cross-point phase change memory devices and, in particular, to metal oxide liners for phase change memory cell material stacks.

As described above, it may be advantageous to reduce oxidation of materials in a phase change memory cell. Notably, as device sizes continue to scale to smaller dimensions, such oxidation and other problems due to downstream processing cause reduced device performance that becomes critical. In some embodiments, a conformal dense film liner is provided on and at least partially covering a memory cell material stack. As used herein, the term liner indicates one or more material layers that at least partially encapsulate one or more materials. The term conformal indicates the liner has substantially the same thickness along the material stack. The memory cell material stack discussed herein includes any number of material layers of a phase change memory cell. In some embodiments, the memory cell material stack includes at least a phase change material layer and a switching layer. In some embodiments, the memory cell material stack includes a middle electrode layer between the phase change material layer and the switching layer. In some embodiments, the memory cell material stack further includes top and bottom electrodes and top and bottom contacts.

The conformal liner may include a single material or multiple material layers. The material layer on (i.e., immediately adjacent) the memory cell material stack includes a metal (e.g., rare earth oxide) that may be advantageously applied via low temperature thermal atomic layer deposition. As used herein, the term low temperature thermal atomic layer deposition (ALD) indicates atomic layer deposition performed at a relatively low temperature such as a temperature in the range of 150 to 350° C. and not more than 350° C. The term atomic layer deposition indicates deposition via sequential application of gas phase chemistries. In some embodiments, the rare earth oxide liner on the memory cell material stack is lanthanum oxide such that the material layer of the liner on the memory cell material stack includes lanthanum and oxygen. In some embodiments, the rare earth oxide liner on the memory cell material stack is hafnium silicate such that the material layer of the liner on the memory cell material stack includes hafnium, silicon, and oxygen. In some embodiments, the rare earth oxide liner on the memory cell material stack is hafnium oxide such that the material layer of the liner on the memory cell material stack includes hafnium and oxygen. In some embodiments, the rare earth oxide liner on the memory cell material stack is aluminum oxide such that the material layer of the liner on the memory cell material stack includes aluminum and oxygen.

In some embodiments, such materials are provided as a laminate structure on the memory cell material stack. For example, in addition to the discussed material layer on the memory cell material stack, one or more additional material layers may be provided. Such laminate structures of two or more material layers may offer improved performance in terms of adhesion (as provided by the material layer on the memory cell material stack), improved dielectric performance, improved resistance to later processing, etc. In some embodiments, the liner includes a layer of lanthanum oxide on the memory cell material stack and one of aluminum oxide or hafnium oxide on the lanthanum oxide layer. In some embodiments, the liner includes a layer of lanthanum oxide on the memory cell material stack, a layer of aluminum oxide on the lanthanum oxide layer, and a layer of hafnium oxide on the aluminum oxide layer. In some embodiments, the liner includes a layer of hafnium silicate on the memory cell material stack and one of aluminum oxide or hafnium oxide on the hafnium silicate layer. In some embodiments, the liner includes a layer of hafnium silicate on the memory cell material stack, a layer of aluminum oxide on the hafnium silicate layer, and a layer of hafnium oxide on the aluminum oxide layer. Other combinations are available as discussed herein below.

The discussed rare earth oxide liner is on sidewalls of the memory cell material stack and may optionally be on a top of the memory cell material stack. Notably, the term memory cell material stack indicates a material stack inclusive of at least a phase change material layer and a switching layer. In some embodiments, the phase change material layer includes a chalcogenide capable of a phase change under the operating conditions of the memory device and the switching layer includes a chalcogenide that does not change phase under the operating conditions of the memory device. The memory cell material stack may also optionally include electrodes, contacts, access lines, etc. Such materials of the memory cell material stack are stacked in a particular dimension and the sidewalls thereof are covered by the rare earth oxide liner.

The liners discussed herein provide a variety of advantages. Notably, the liner materials may be applied via low temperature thermal ALD, which provides a highly conformal layer even at high aspect ratios without high temperature processing that can damage previously applied materials. Furthermore, the formation of the liner may be advantageously provided without use of a strong oxidizer such as ozone or water. The liner is dense and thereby protects the memory cell material stack from subsequent processing. Furthermore, the discussed rare earth oxide materials have oxygen gettering properties that provide extraction of undesirable oxygen from the memory cell material stack. Such undesirable oxygen may be formed during operations used to fabricate the memory cell material stack such as wet and/or dry etch operations, for example. The liner materials are non-conductive and have relatively low dielectric coefficients to aid in isolation of adjacent memory cell material stack. Further still, the liner materials discussed provide good adhesion properties with respect to the memory cell material stack for improved processing yields, fewer failures, and protection during subsequent processing.

FIG. 1 is an illustration of a cross-sectional view of a phase change memory structure 100 including a metal oxide liner 109, arranged in accordance with at least some implementations of the present disclosure. Phase change memory structure 100 may also be characterized as a device structure or simply a device. As shown in FIG. 1, phase change memory structure 100 includes a memory cell material stack 111 at least partially encapsulated by liner 109. In the illustrated example, memory cell material stack 111 includes a bottom contact 101, a bottom electrode 102, a switching layer or switching device 103, a middle electrode 104, a phase change material layer 105, a top electrode 106, a lamella layer 107, and a top contact 108.

Bottom contact 101 and top contact 108 may include any suitable conductive materials such as tungsten. Lamella layer 107 may include any suitable material or materials such as a laminate of tungsten and carbon. In some embodiments, bottom contact 101 and top contact 108 provide access lines (e.g., a word line and a bit line) to access a phase change memory cell 121. As used herein, the term access line is used to indicate a word line or a bit line. For example, bottom contact 101 may extend in the x-dimension and top contact 108 may extend in the y-dimension to form a cross-point architecture. In such contexts, phase change memory cell 121 includes the other materials of memory cell material stack 111. In other embodiments, bottom contact 101 and top contact 108 contact such access lines (not shown in FIG. 1). For example, a bottom access line (e.g., a copper line or other conductive trace) may extend in the x-dimension under bottom contact 101 such that bottom contact 101 is in contact with the bottom access line and a top access line may extend in the y-dimension over top contact 108 such that over top contact 108 is in contact with the top access line. In such examples, the top portion of rare earth oxide liner 109 may be removed.

In any context, liner 109 is on sidewalls 112 of memory cell material stack 111. In the example of FIG. 1, sidewalls 112 are shown as vertically out of alignment, as may be expected due to processing (e.g., etching of the materials of memory cell material stack 111). However, any such sidewall shape or profile may be employed such as vertically aligned sidewalls (as illustrated herein below). As discussed, liner 109 protects memory cell material stack 111 during subsequent processing and provides oxygen gettering for undesirable oxygen in memory cell material stack 111. For example, the oxygen (e.g., $O_2$) gettering properties of liner 109 advantageously enhance device performance by repairing oxide damage during wafer processing and in device operation.

Liner 109 may extend on any portion of sidewalls 112. In the illustrated embodiment, liner 109 is on the sidewalls of each of top contact 108, lamella layer 107, top electrode 106, phase change material layer 105, middle electrode 104, switching device 103, and bottom electrode 102 while being on a portion of bottom contact 101. In some embodiments, is on sidewalls of top electrode 106, phase change material layer 105, middle electrode 104, switching device 103, and bottom electrode 102 while being absent from one or more of the sidewalls of top contact 108 and lamella layer 107. Other configurations are available. Furthermore, in the example of FIG. 1, liner 109 is on a top surface 113 of top contact 108. In some embodiments, liner 109 is removed from top surface 113.

Liner 109 may include any metal oxide material such as an oxidized rare earth metal. In some embodiments, liner 109 includes a relatively pure (e.g., >99.9%) metal oxide. In some embodiments, the metal oxide further includes other elements such as silicon. The metal may include one of lanthanum, hafnium, aluminum, or others as discussed below. It is noted, herein the term rare earth metal is used for the sake of clarity and not limitation and is inclusive of hafnium and aluminum. In some embodiments, liner 109 is lanthanum oxide ($La_xO_{1-x}$). In some embodiments, liner 109 is hafnium silicate ($Hf_xSi_yO_{1-x-y}$). In some embodiments, liner 109 is hafnium oxide ($Hf_xO_{1-x}$). In other embodiments, liner 109 includes oxygen and one of scandium, yttrium, cerium, praseodymium, neodymium, promethium, samarium, europium, gadolinium, terbium, dysprosium, holmium, erbium, thulium, ytterbium, or lutetium. Liner 109 may have any suitable structure. In some embodiments, liner 109 is a polycrystalline material. In some embodiments, liner 109 is polycrystalline lanthanum oxide.

In the embodiment of FIG. 1, liner 109 includes a single material layer. For example, liner 109 may be applied in a single low temperature thermal ALD operation as discussed further herein below. In other embodiments, as discussed further with respect to FIG. 1, a liner may include a laminate of material layers.

In some embodiments, memory cell material stack 111 is a chalcogenide based phase change memory cell. As discussed, memory cell material stack 111 is accessed via bottom contact 101 and top contact 108 or access lines coupled to bottom contact 101 and top contact 108. Memory cell material stack 111 includes bottom electrode 102 on and coupled to bottom contact 101, switching device 103 on and coupled to bottom electrode 102, a middle electrode 104 on and coupled to switching device 103, a phase change material layer 105 on and coupled to middle electrode 104, top electrode 106 on and coupled to phase change material layer 105, lamella layer 107 on and coupled to top electrode 106, and top contact 108 on and coupled to lamella layer 107. As used herein, the term electrode simply indicates a conductive material and, in some contexts, a conductor to separate other elements of memory cell material stack 111.

In some embodiments, switching device 103 and phase change material layer 105 (which may be characterized as a storage element or storage device), employ chalcogenide materials such that phase change material layer 105 is capable of a phase change that is then non-volatile during the operation of the memory device while the chalcogenide material of switching device 103 change phases during operation. In some embodiments, phase change material layer 105 includes a chalcogenide based alloy of indium, antimony, and tellurium (i.e., an IST material system). In some embodiments, phase change material layer 105 includes a chalcogenide based alloy of germanium, antimony, and tellurium (i.e., a GST material system). Any suitable stoichiometries of such material systems may be employed. Furthermore, other phase change material systems may be used such those including indium, antimony, tellurium, germanium, selenium, gallium, arsenic, tin, bismuth, silicon, oxygen, gold, palladium, titanium, cobalt, or platinum. In some embodiments, switching device 103 also includes a chalcogenide based alloy material system such as those described above. In some embodiments, the chalcogenide based alloy material system of switching device 103 includes one or more elements to suppress phase change.

Bottom electrode 102, middle electrode 104, and top electrode 106 may include any material or materials that provide electrical coupling between bottom contact 101 and switching device 103, between switching device 103 and phase change material layer 105, and between phase change material layer 105 and top electrode 106, respectively, while preventing diffusion or reactions therebetween. In some embodiments, bottom electrode 102, middle electrode 104, and top electrode 106 each comprises a carbon or carbon based layer.

As shown, phase change memory structure 100 may be a high aspect ratio structure having a width, W, (as measured by the widest layer, as an average of the layers, or the like) and a height, H, (inclusive of bottom contact 101, lamella layer 107, and top contact 108, as shown, or inclusive of only bottom electrode 102, switching device 103, middle electrode 104, phase change material layer 105, and top electrode 106). In some embodiments, the width of phase change memory structure 100 is in the range of 10 to 30 nm. In some embodiments, the width of phase change memory structure 100 is in the range of 15 to 40 nm. In some embodiments, the pitch between adjacent phase change memory structures in a memory array is in the range of 15 to 25 nm. In some embodiments, the height of phase change memory structure 100 (e.g., based on either discussed measure) is in the range of 70 to 400 nm. In some embodiments, the height of phase change memory structure 100 is in the range of 140 to 350 nm.

The aspect ratio of phase change memory structure 100 (e.g., the ratio of the height to the width) may be any suitable value. In some embodiments, the aspect ratio is not less than seven to one. In some embodiments, the aspect ratio is in the range of seven to one to ten to one. In some embodiments, the aspect ratio is not less than ten to one. As discussed further herein below, application of liner 109 via low temperature thermal ALD provides a highly conformal deposition even in the context of high aspect ratios. The thickness of liner 109 may be any suitable thickness. In some embodiments, the thickness of liner 109 is not greater than 8 nm. The thickness of liner 109 may be measured at any point along sidewall 112. In some embodiments, the thickness of liner 109 is in the range of 4 to 8 nm. In some embodiments, the thickness of liner 109 is not greater than 6 nm.

Figure 2:
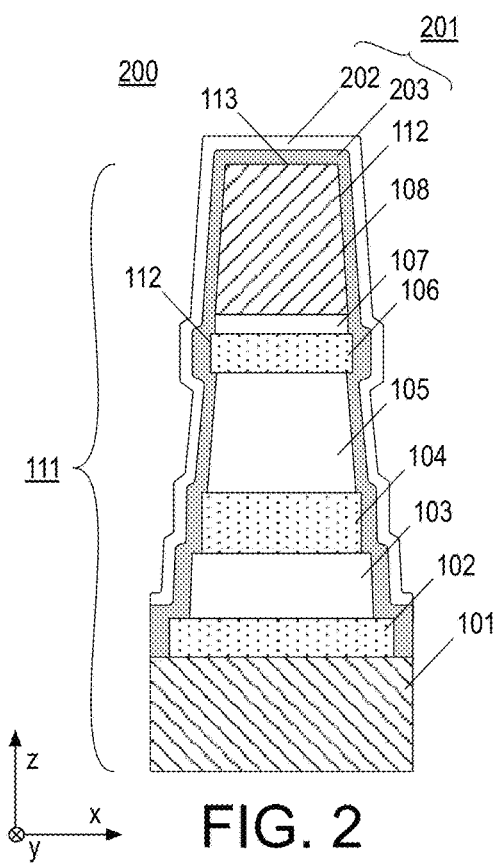
FIG. 2 is an illustration of a cross-sectional view of a phase change memory structure including a multilayer metal oxide liner.

FIG. 2 is an illustration of a cross-sectional view of a phase change memory structure 200 including a multilayer metal oxide liner 201, arranged in accordance with at least some implementations of the present disclosure. In the context of FIG. 2 and elsewhere herein, like numbered or referenced components share the same characteristics. Phase change memory structure 200 may also be characterized as a device structure or simply a device. As shown in FIG. 2, phase change memory structure 200 includes memory cell material stack 111 at least partially encapsulated by multilayer liner 201 having a material layer 202 on one or more components of memory cell material stack 111 and a second material layer 203 on material layer 202. As discussed with respect to FIG. 1, memory cell material stack 111 may include bottom contact 101, bottom electrode 102, switching device 103, middle electrode 104, phase change material layer 105, top electrode 106, lamella layer 107, and top contact 108, and such components may have any characteristics discussed herein.

Multilayer liner 201 may include any number of material layers in any configuration as discussed with respect to liner 109. In some embodiments, multilayer liner 201 includes two material layers 202, 203, as shown. In some embodiments, multilayer liner 201 includes three material layers 202, 203. In some embodiments, multilayer liner 201 includes four or more material layers. Notably, use of multilayer liner 201 may provide improved flexibility and capability with respect to the desired liner characteristics (insulating properties, oxygen gettering capability, adhesion properties, etc.) at the cost of increased processing complexity.

As shown, material layer 202 is on (i.e., immediately adjacent) to at least portions of memory cell material stack 111. Material layer 202 may include any material discussed with respect to liner 109. In some embodiments, material layer 202 is lanthanum oxide. In some embodiments, material layer 202 is hafnium silicate. In some embodiments, material layer 202 is hafnium oxide. Material layer 203 may also include any material discussed with respect to liner 109. In some embodiments, material layer 203 is aluminum oxide. Furthermore, any additional number of material layers may be provided in a laminate structure. Such additional layers may also include any materials discussed with respect to liner 109.

In some embodiments, the materials of multilayer liner 201 are selected based on the function of that material in the stack. For example, material layer 202 may advantageously provide good adhesion and oxygen gettering while material layer 203 (and, optionally, others in the laminate structure) may provide improved density, stability, and structural strength as well as improved insulating properties. As discussed, the oxygen gettering properties of material layer 202 may advantageously enhance device performance by repairing oxide damage during wafer processing and in device operation. In some embodiments, material layer 202 is lanthanum oxide and material layer 203 is aluminum oxide. In some embodiments, material layer 202 is lanthanum oxide and material layer 203 is hafnium oxide. In some embodiments, material layer 202 is lanthanum oxide, material layer 203 is aluminum oxide, and a third material is on material layer 203, the third material layer being one of lanthanum oxide or hafnium oxide. In some embodiments, material layer 202 is hafnium silicate and material layer 203 is aluminum oxide. In some embodiments, material layer 202 is hafnium silicate and material layer 203 is hafnium oxide. In some embodiments, material layer 202 is hafnium silicate, material layer 203 is aluminum oxide, and a third material is on material layer 203, the third material layer being one of hafnium silicate or hafnium oxide.

Figure 3:
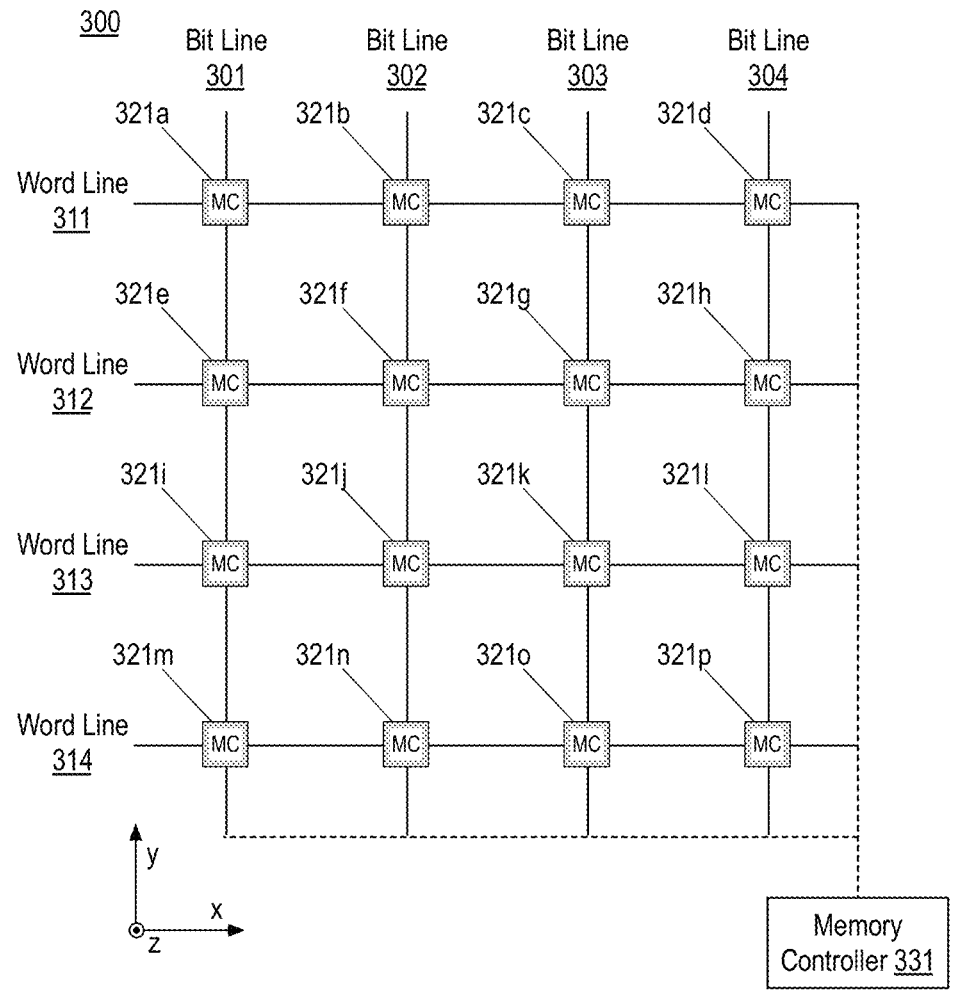
FIG. 3 is a diagram of an integrated memory circuit including a phase change memory structure having a metal oxide liner.

FIG. 3 is a diagram of an integrated memory circuit 300 including a phase change memory structure having a metal oxide liner, arranged in accordance with at least some implementations of the present disclosure. As shown, integrated memory circuit 300 includes a memory controller 331, a number of word lines 311, 312, 313, 314, a number of bit lines 301, 302, 303, 304 and intersections therebetween interconnected by memory cells 321a-p. In the context of FIG. 3, any or all of memory cells 321a-p may include phase change memory structure 100, phase change memory structure 200, or any other phase change memory structure discussed herein. As shown, each of memory cells 321a-p provides a non-volatile memory cell corresponding to the intersection of one of word lines 311, 312, 313, 314 and one of bit lines 301, 302, 303, 304 (memory cell 321a is at the intersection of bit line 301 and word line 311, and so on). In some embodiments, one of word lines 311, 312, 313, 314 and one of bit lines 301, 302, 303, 304 correspond to top contact 108 and bottom contact 101.

Each of memory cells 321a-p may be individually read using one of word lines 311, 312, 313, 314 and one of bit lines 301, 302, 303, 304 via memory controller 331. As discussed herein, each of memory cells 321a-p includes a phase change material layer (or phase change memory device) capable of being programmed between two phase states having differing resistances. The different resistances may be detected (by application of a potential across the memory cell) and used to provide a read of the memory state (i.e., 1 or 0 of the memory cell). The phase state (and corresponding resistance state) is persistent over time and therefore integrated memory circuit 300 provides non-volatile memory.

To write to any of memory cells 321a-p, memory controller 331 again accesses the pertinent memory cell using one of word lines 311, 312, 313, 314 and one of bit lines 301, 302, 303, 304. A potential (i.e., different than the potential used to perform the read) is applied to change the phase of the phase change material layer to the desired phase for later detection.

As discussed, any or all of memory cells 321a-p may include phase change memory structure 100. In some embodiments, with reference to FIGS. 1 and 2, integrated memory circuit 300 includes a memory cell having phase change material layer 105 and switching device 103 separated by middle electrode 104. The memory cell may also include bottom electrode 102 and top electrode 106. The memory cell further includes liner 109 or multilayer liner 201 on sidewalls of the memory cell as discussed above.

Figure 4:
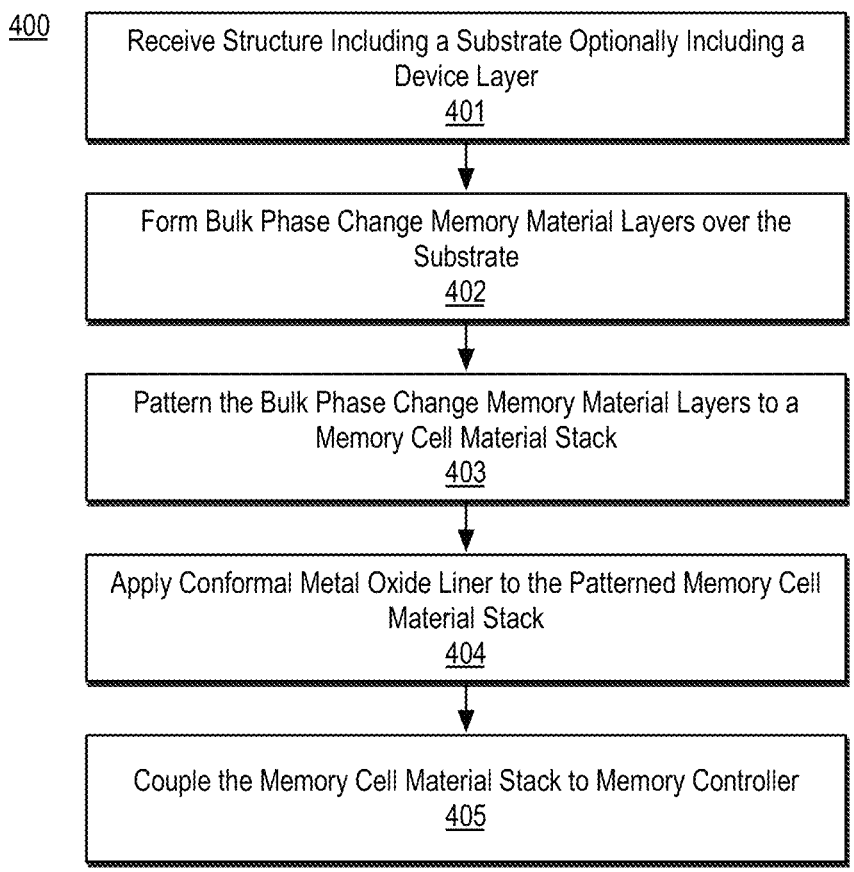
FIG. 4 is a flow diagram illustrating methods for forming phase change memory structures.

FIG. 4 is a flow diagram illustrating methods 400 for forming phase change memory structures, arranged in accordance with at least some implementations of the present disclosure. FIGS. 5, 6, 7, 8, 9, 10, 11, 12, 13, 14, 15, 16, 17, 18, 19, 20, and 21 are illustrations of exemplary phase change memory structures as selected fabrication operations in methods 400 are performed, arranged in accordance with at least some implementations of the present disclosure.

As shown in FIG. 4, methods 400 begin at operation 401, where a structure is received for processing. The received structure is a partially fabricated structure that may be formed on a substrate wafer. In some embodiments, a device layer is formed within, on, and/or over the substrate wafer. The device layer may include any devices such as transistors, capacitors, resistors, optoelectronic devices, switches, or any other active or passive electronic devices. The received structure may further include one or more metallization layers over the device layer. In some embodiments, no metallization layers are formed over the device layer. Such devices and metallization layer(s) may be formed using any suitable technique or techniques known in the art.

Methods 400 continue at operation 402, where bulk phase change memory material layers are formed over the substrate. The bulk phase change memory material layers may include any (not yet patterned) layers discussed with respect to memory cell material stack 111. In some embodiments, the bulk phase change memory material layers include a bottom contact material layer, a bottom electrode material layer, a switching device material layer, a middle electrode material layer, a phase change material layer, and a top electrode material layer. In such contexts, those layers may be patterned to form rows of material layers and a subsequent bulk lamella layer and top contact material layer may be formed and patterned. In such contexts, the bottom and top contacts provide the memory access lines (i.e., word and bit lines). Such examples are illustrated with respect to FIGS. 5, 6, 7, 8, 9, 10.

In other embodiments, the bulk phase change memory material layers include a bottom contact material layer, a bottom electrode material layer, a switching device material layer, a middle electrode material layer, a phase change material layer, a top electrode material layer, a lamella layer, and a top contact material layer. In such contexts, those layers may be formed over bottom access lines and then patterned to form pillars. After formation of the pillars, rows of top access lines are formed over the top contacts. In such contexts, the bottom and top contacts contact the memory access lines (i.e., word and bit lines). Such examples are illustrated with respect to FIGS. 11, 12, 13, 14, 15, and 16.

Figure 9:
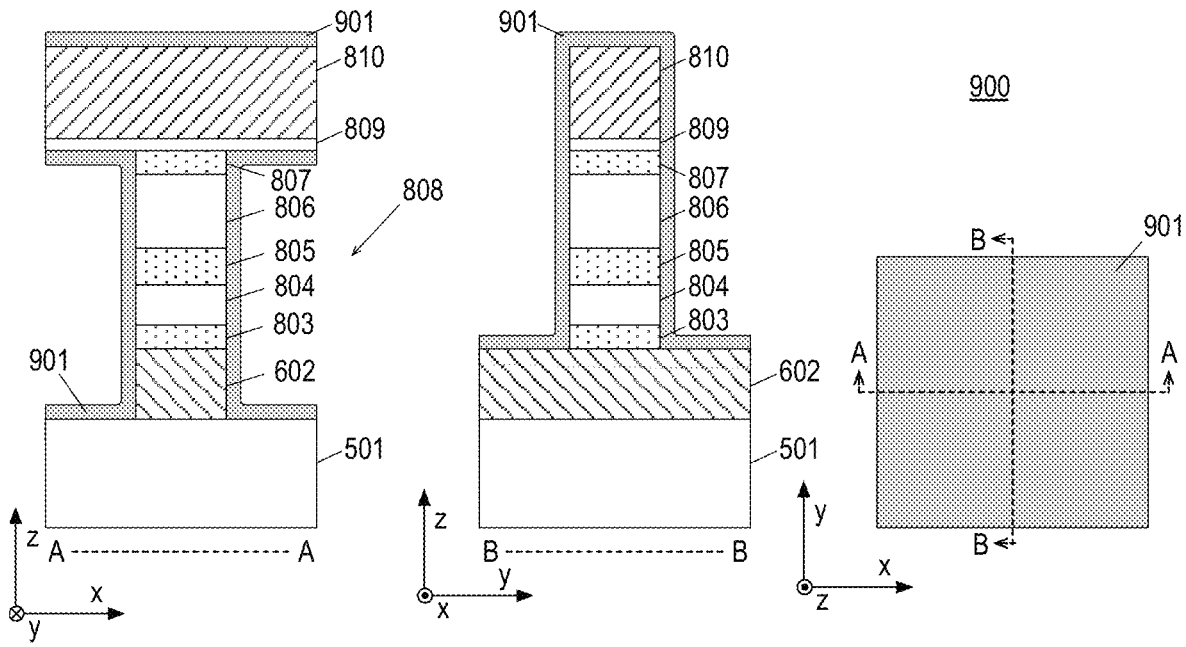
Figure 14:
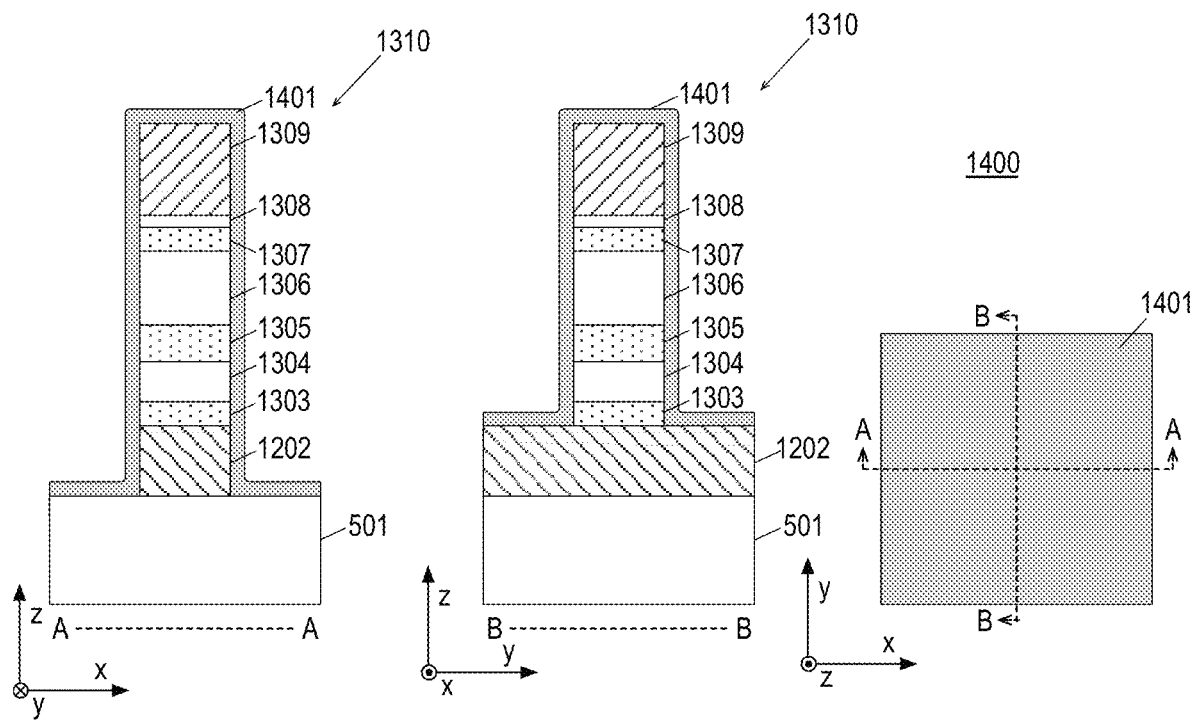

In either case, the discussed liner or multilayer liner may be formed in a single operation as shown with respect to FIGS. 9 and 14, respectively. Alternatively, the liner or multilayer liner may be formed both after the patterning of rows of bulk phase change memory material layers and after patterning the rows into pillars. Such techniques provide a single layer on some sidewalls of the memory cell and a dual layer on other sidewalls. Such techniques may be provided in either the context of the top and bottom contacts providing access lines or the context of the top and bottom contacts coupling to other access lines, and are illustrated with respect to the latter context with respect to FIGS. 17, 18, 19, 20, and 21.

Methods 400 continue at operation 403, where the bulk phase change memory material layers are patterned to form a memory cell material stack. The memory cell material stack includes at least a switching device 103 and a phase change material layer separated by a middle electrode and may also include top and bottom electrodes as discussed herein. In some embodiments, the memory cell material stack further includes top and bottom electrode that are coupled to access lines. In other embodiments, the memory cell material stack are coupled to top and bottom electrode that provide the access lines.

Methods 400 continue at operation 404, where a conformal metal oxide liner is applied to the patterned memory cell material stack. The conformal metal oxide liner may be a single material layer or multiple material layers including any of those discussed herein. The conformal metal oxide liner is advantageously applied or deposited using low temperature thermal ALD. In some embodiments, the low temperature thermal ALD is performed at temperature not exceeding 350° C. In some embodiments, the low temperature thermal ALD is performed at temperature not exceeding 300° C. In some embodiments, the low temperature thermal ALD is performed at temperature not exceeding 250° C. In some embodiments, the low temperature thermal ALD is performed at temperature not exceeding 200° C. In some embodiments, the low temperature thermal ALD is performed at temperature not exceeding 150° C. Such low temperature processing advantageously reduces damage to previously applied materials.

Methods 400 continue at operation 405, where the patterned and lined (coated) memory cell material stack is coupled to a memory controller and/or other circuitry of a memory device.

As discussed, the top and bottom contacts may provide access lines for the memory cell material stack or they may contact to access lines. In some embodiments, coupling the memory cell material stack includes forming the stack on a bottom access line and forming a top access line on the memory cell material stack. In some embodiments, forming the memory cell material stack also forms the bottom and top access lines. In either context. the access lines may be coupled to a memory controller using routing techniques such that the memory controller may access the memory cell of the memory cell material stack as discussed with respect to FIG. 3. Furthermore, any number of additional layers of memory cell material stacks may be formed over the top access line (which serves as a bottom access line for the next layer of memory cell material stacks), and so on to form a stacked memory structure.

Figure 5:
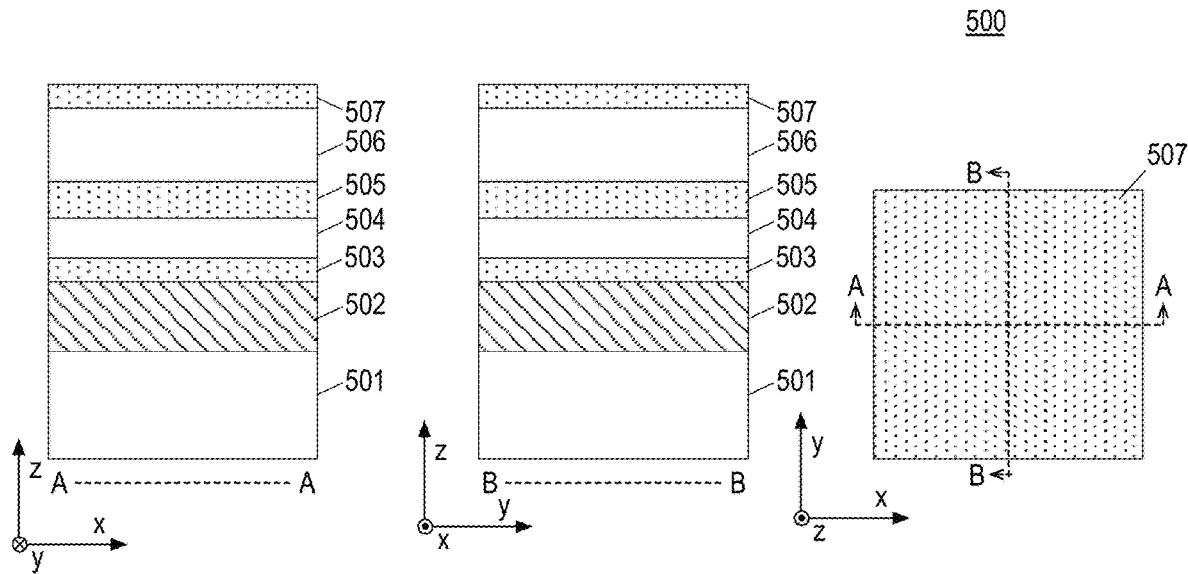
FIGS. 5, 6, 7, 8, 9, 10, 11, 12, 13, 14, 15, 16, 17, 18, 19, 20, and 21 are illustrations of exemplary phase change memory structures as selected fabrication operations in the methods of FIG. 4 are performed.

FIG. 5 is an illustration of an example phase change memory structure 500 including bulk phase change memory material layers are formed over a substrate 501. In FIGS. 5 to 21, a top down view and two cross sectional views are shown. The top down view shows the phase change memory structure in the x-y plane, a first cross sectional view (taken along the A-A line) shows a view in the x-z plane, and a second cross sectional view (taken along the B-B line) shows a view in the y-z plane.

With continued reference to FIG. 5, substrate 501 may include any suitable material or materials inclusive of a semiconductor material such as monocrystalline silicon, germanium, silicon germanium, a III-V materials based material (e.g., gallium arsenide), a silicon carbide, a sapphire, or any combination thereof. As discussed, a device layer may be formed in substrate 501 and the device layer may include transistors, memory devices, capacitors, resistors, optoelectronic devices, switches, or any other active or passive electronic devices.

As shown, a bottom contact material layer 502 is formed on or over substrate 501. Bottom contact material layer 502 may include any suitable material or materials discussed herein such as tungsten or other conductive materials such as copper, aluminum, etc. Bottom contact material layer 502 may be formed using any suitable technique or techniques such as electroplating techniques. Bottom contact material layer 502 may have any thickness (in the z-dimension) such as a thickness in the range of 60 to 100 nm or a thickness in the range of 100 to 200 nm.

A bottom electrode material layer 503 is formed on or over bottom contact material layer 502. Bottom electrode material layer 503 may include any suitable material or materials discussed herein such as a carbon layer or a carbon based layer. Bottom electrode material layer 503 may be formed using any suitable technique or techniques such as chemical vapor deposition (CVD) techniques. Bottom electrode material layer 503 may have any thickness such as a thickness in the range of 10 to 30 nm. A switching device material layer 504 is formed on or over bottom electrode material layer 503. Switching device material layer 504 may include any suitable material or materials discussed herein such as a IST or GST material systems. Switching device material layer 504 may be formed using any suitable technique or techniques such as CVD techniques. Switching device material layer 504 may have any thickness such as a thickness in the range of 15 to 50 nm.

A middle electrode material layer 505 is formed on or over switching device material layer 504. Middle electrode material layer 505 may include any suitable material or materials discussed herein such as a carbon layer or a carbon based layer and it may be formed using any suitable technique or techniques such as CVD. Middle electrode material layer 505 may have any thickness such as a thickness in the range of 10 to 30 nm. As shown, a phase change material layer 506 (e.g., a bulk unpatterned phase change material layer) is formed on or over middle electrode material layer 505. Phase change material layer 506 may include any suitable material or materials discussed herein such as a IST or GST material systems with an element to dampen phase change and it may be formed using any suitable technique or techniques such as CVD techniques. Phase change material layer 506 may have any thickness such as a thickness in the range of 30 to 70 nm.

A top electrode material layer 507 is formed on or over phase change material layer 506 such that top electrode material layer 507 may include any suitable material or materials discussed herein such as a carbon layer or a carbon based layer. Top electrode material layer 507 may be formed using any suitable technique or techniques such as CVD techniques to any thickness such as a thickness in the range of 10 to 30 nm.

Figure 6:
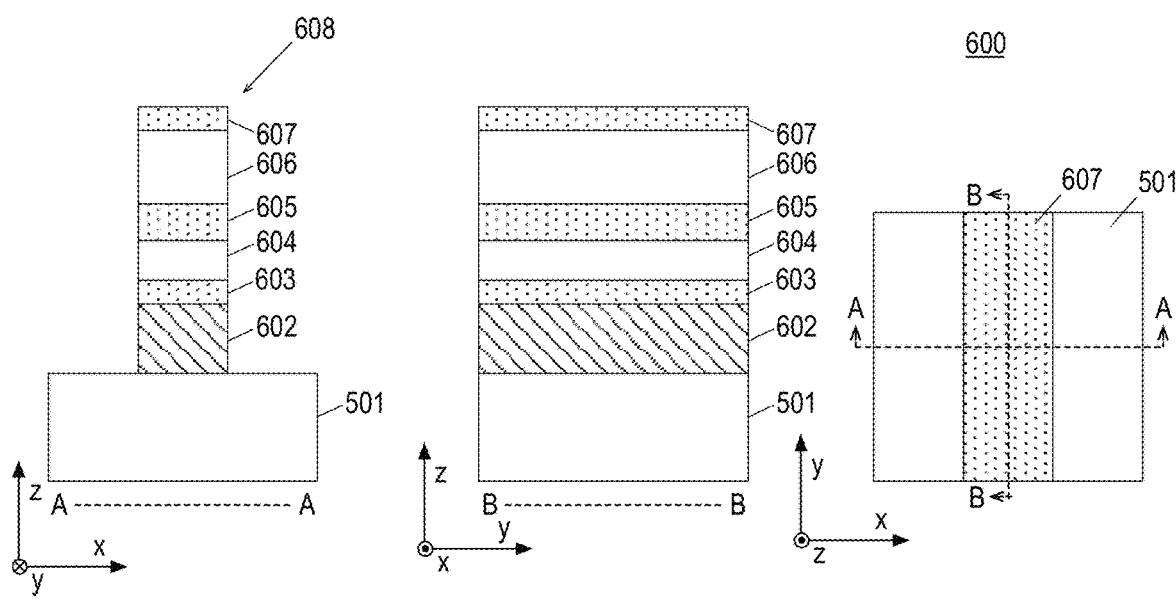

FIG. 6 is an illustration of an example phase change memory structure 600 similar to phase change memory structure 500 after patterning the bulk phase change memory material layers to form any number of rows of material layers. As shown, top electrode material layer 507, phase change material layer 506, middle electrode material layer 505, switching device material layer 504, bottom electrode material layer 503, and bottom contact material layer 502 are patterned using any suitable technique or techniques such as photolithography (inclusive of a hard mask) and wet and dry etch techniques to form patterned top electrode material layer 607, phase change material layer 606, middle electrode material layer 605, switching device material layer 604, bottom electrode material layer 603, and bottom contact material layer 602, which provide a row of the multiple rows (not shown). Notably, the patterning provides any number of rows or lines such as a line 608 including the patterned material layers. Furthermore, the pattern may be subsequently maintained in bottom contact material layer 602 such that bottom contact material layer 602 provides an access line for the resultant memory cell.

Figure 7:
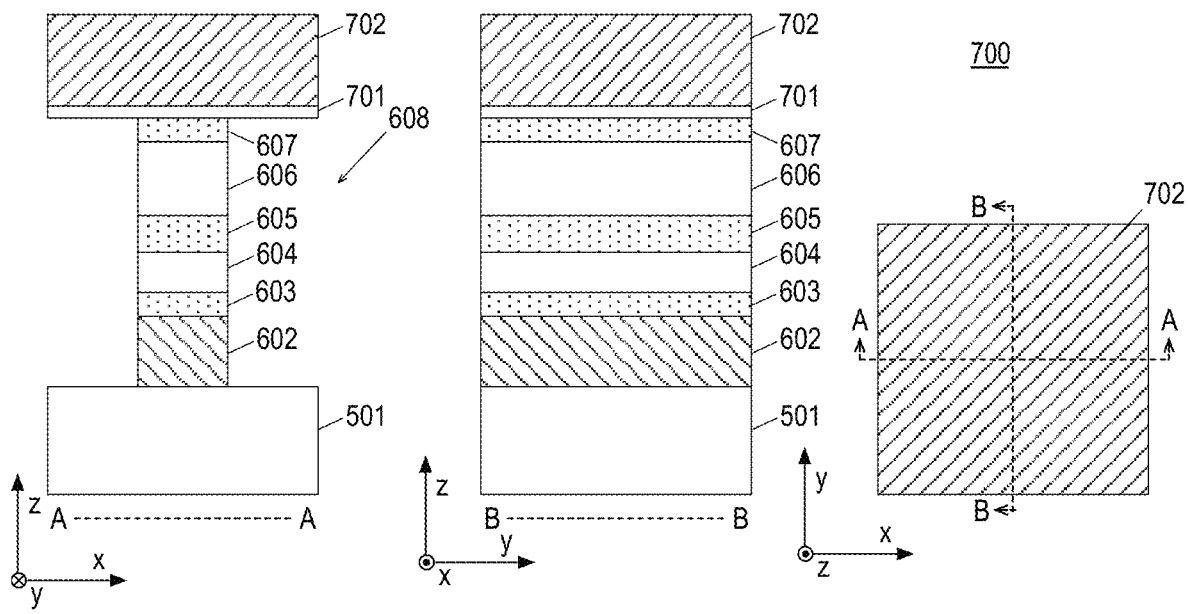

FIG. 7 is an illustration of an example phase change memory structure 700 similar to phase change memory structure 600 after the formation of a lamella layer 701 and a top contact material layer 702. Although illustrated as extending along a bottom of top contact material layer 702, in some embodiments, lamella layer 701 is formed only at the top surface of patterned top electrode material layer 607. As shown, in some embodiments, lamella layer 701 and top contact material layer 702 may span gaps between lines 608. In other embodiments, a fill may be provided between lines 608, which is subsequently removed. Lamella layer 701 and top contact material layer 702 may be formed using any suitable technique or techniques such as bulk deposition techniques and lamella layer 701 and top contact material layer 702 may include any suitable materials such as a laminate of carbon and tungsten and tungsten, respectively, at any thicknesses such as lamella layer 701 having a thickness of 5 to 10 nm and top contact material layer 702 having a thickness in the range of 60 to 100 nm or a thickness in the range of 100 to 200 nm.

Figure 8:
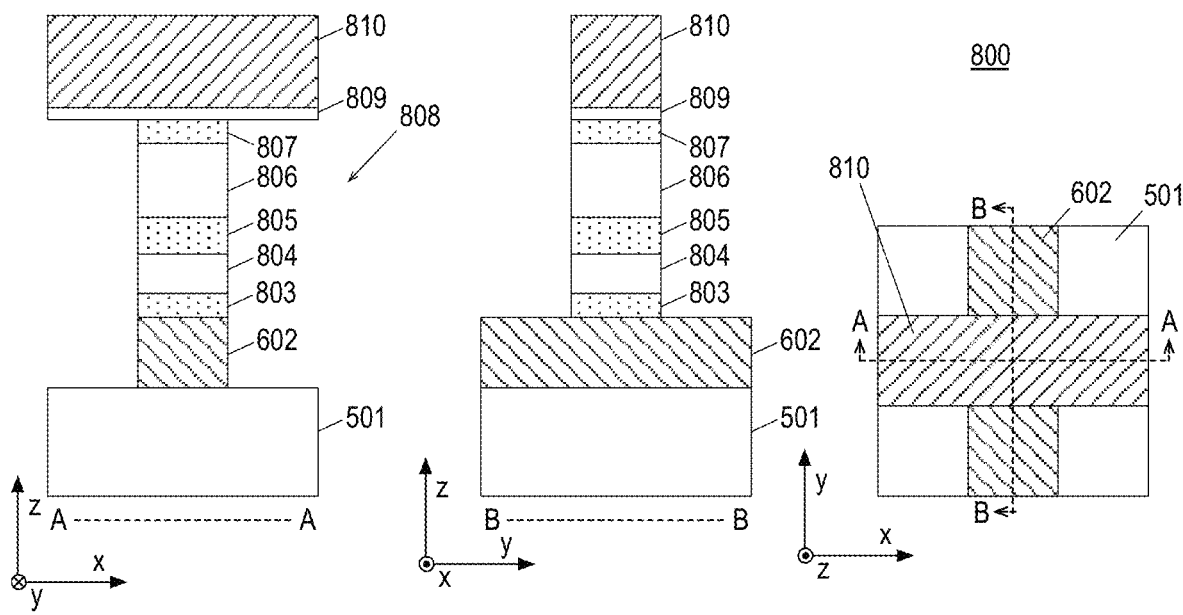

FIG. 8 is an illustration of an example phase change memory structure 800 similar to phase change memory structure 700 after patterning the phase change memory material layers to form any number of pillars of material layers and a patterned top contact 810. As shown, patterned top electrode material layer 607, phase change material layer 606, middle electrode material layer 605, switching device material layer 604, bottom electrode material layer 603, and bottom contact material layer 602 are again patterned using any suitable technique or techniques such as photolithography and wet and dry etch techniques to form patterned top contact 810, lamella layer 809, top electrode material layer 807, phase change material layer 806, middle electrode material layer 805, switching device material layer 804, and bottom electrode material layer 803. It is noted that bottom contact material layer 602 is not patterned as it provides an access line as patterned with respect to FIG. 6. Furthermore the patterning discussed with respect to FIG. 8 provides orthogonal access lines (i.e., patterned top contact 810) with a memory cell at intersections thereof.

FIG. 9 is an illustration of an example phase change memory structure 900 similar to phase change memory structure 800 after the formation of a conformal metal oxide liner 901. Conformal liner 901 may include any materials discussed with respect to liner 109 or multilayer liner 201. That is, although illustrated with respect to a single material layer, conformal liner 901 may include multiple layers. Conformal liner 901 is formed via low temperature thermal ALD. Such low temperature processing advantageously reduces damage to previously applied materials. In some embodiments, the low temperature thermal ALD is performed at temperature not exceeding a maximum temperature of 350° C., 300° C., 250° C., 200° C., or 150° C. Conformal metal oxide liner 901 may have any suitable thickness such as a thickness of not more than 8 nm.

Figure 10:
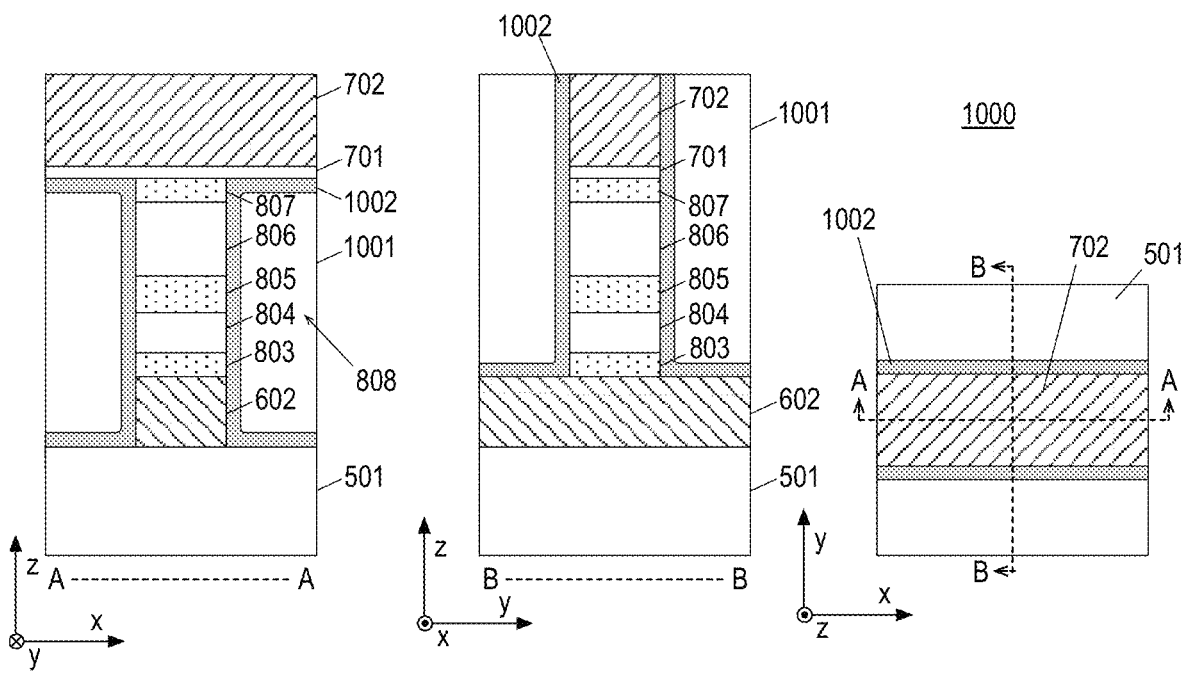

FIG. 10 is an illustration of an example phase change memory structure 1000 similar to phase change memory structure 900 after the formation of a bulk dielectric material and a planar operation to form dielectric material 1001 and metal oxide liner 1002. For example, a bulk dielectric material may be deposited using any suitable technique or techniques such as ALD, CVD, or others to provide a dielectric fill between pillars 808. Such bulk dielectric fill may be followed by a planarization operation to expose top contact material layer 702 (i.e., an access line) and to remove the dielectric fill and portions of conformal metal oxide liner 901 on the top thereof. Thereby, top contact material layer 702 is exposed for use as an access line for memory cells formed thereon. That is, the discussed techniques, or similar, may be used to generate any number of layers of memory cells.

Figure 11:
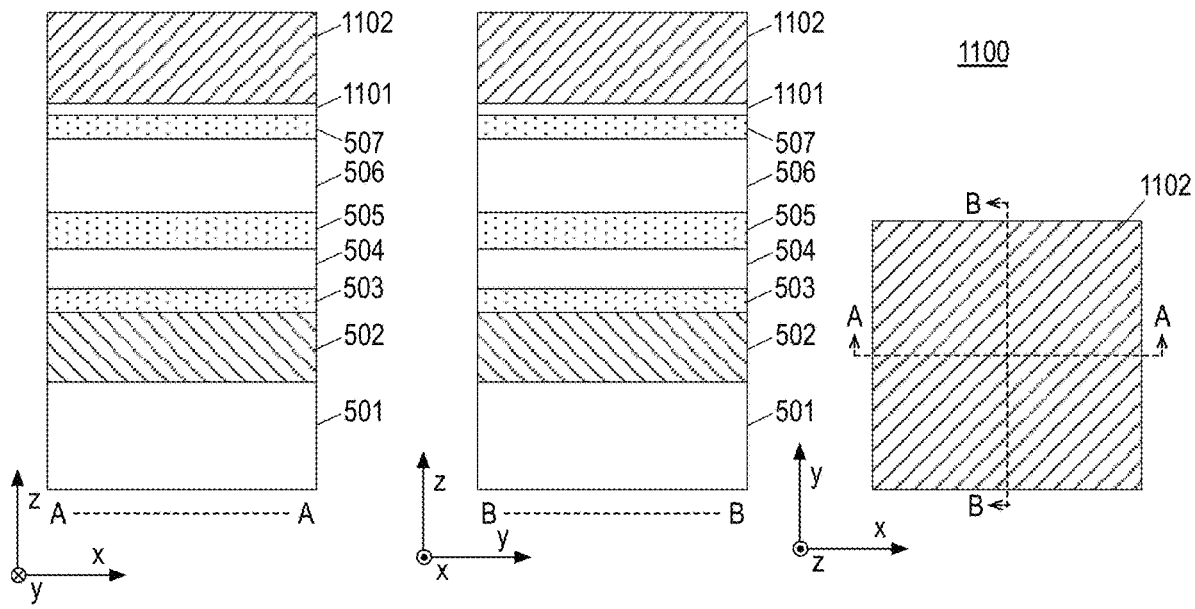

Turning now to techniques where one or both of top and bottom contacts are provided between access lines, FIG. 11 is an illustration of an example phase change memory structure 1100 including bulk phase change memory material layers are formed over substrate 501. As with phase change memory structure 500 (please refer to FIG. 5), phase change memory structure 1100 includes substrate 501, bottom contact material layer 502 formed on or over substrate 501, bottom electrode material layer 503 formed on or over bottom contact material layer 502, switching device material layer 504 formed on or over bottom electrode material layer 503, middle electrode material layer 505 formed on or over switching device material layer 504, phase change material layer 506 formed on or over middle electrode material layer 505, and top electrode material layer 507 formed on or over phase change material layer 506.

Furthermore, a lamella layer 1101 is formed on or over top electrode material layer 507.

Lamella layer 1101 may be formed using any suitable technique or techniques such as bulk deposition techniques and lamella layer 1101 include any suitable material or materials such as a laminate of carbon and tungsten. Lamella layer 1101 may be formed at any thicknesses such as a thickness in the range of 5 to 10 nm. Top contact material layer 1102 is formed on or over lamella layer 1101. Top contact material layer 1102 may include any materials discussed herein such as tungsten and it may be formed using any suitable technique or techniques such as bulk deposition techniques. Top contact material layer 1102 may include any suitable materials such as tungsten at any suitable thickness such as a thickness in the range of 60 to 100 nm or a thickness in the range of 100 to 200 nm.

Figure 12:
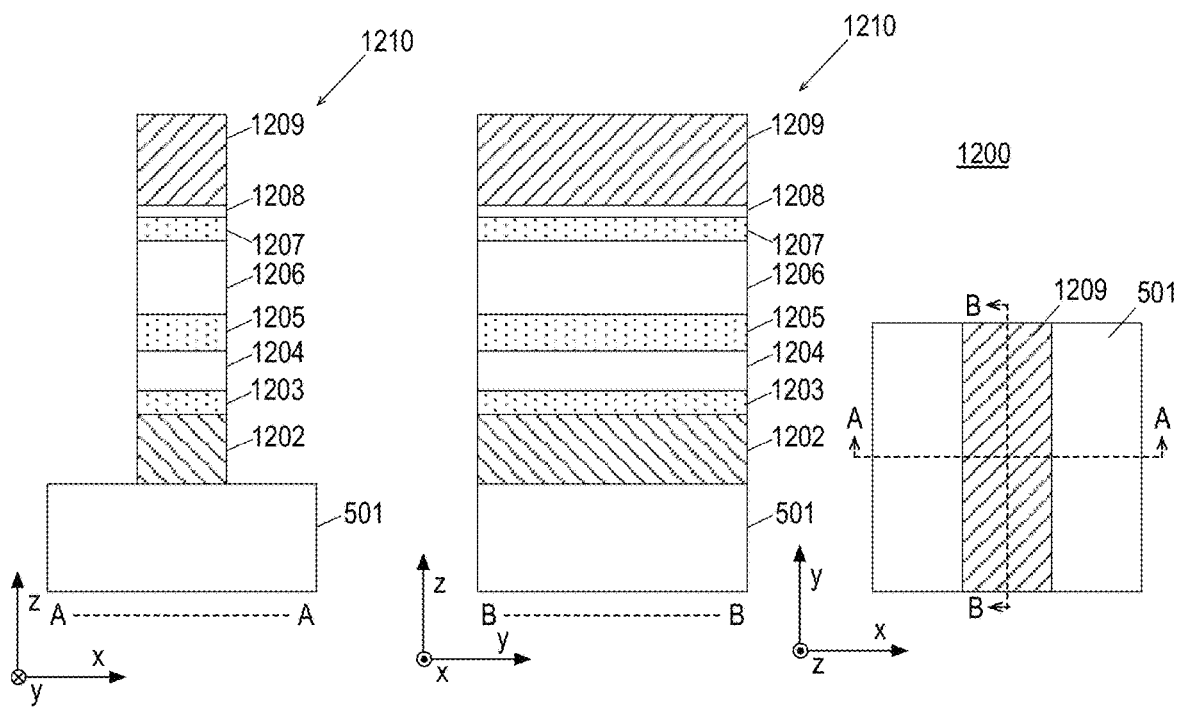

FIG. 12 is an illustration of an example phase change memory structure 1200 similar to phase change memory structure 1100 after patterning the bulk phase change memory material layers to form any number of rows of material layers. As shown, top contact material layer 1102, lamella layer 1101, top electrode material layer 507, phase change material layer 506, middle electrode material layer 505, switching device material layer 504, bottom electrode material layer 503, and bottom contact material layer 502 are patterned using any suitable technique or techniques such as photolithography (inclusive of a hard mask) and wet and dry etch techniques to form patterned top contact material layer 1209, lamella layer 1208, top electrode material layer 1207, phase change material layer 1206, middle electrode material layer 1205, switching device material layer 1204, bottom electrode material layer 1203, and bottom contact material layer 1202, which provide a row of the multiple rows (not shown). Notably, the patterning provides any number of rows or lines such as a line 1210 including the patterned material layers. In some embodiments, the pattern may be subsequently maintained in bottom contact material layer 1202 such that bottom contact material layer 1202 provides an access line for the resultant memory cell. In other embodiments, bottom contact material layer 1202 is also further patterned such that the contact is coupled to an access line in substrate 501 (not shown).

Figure 13:
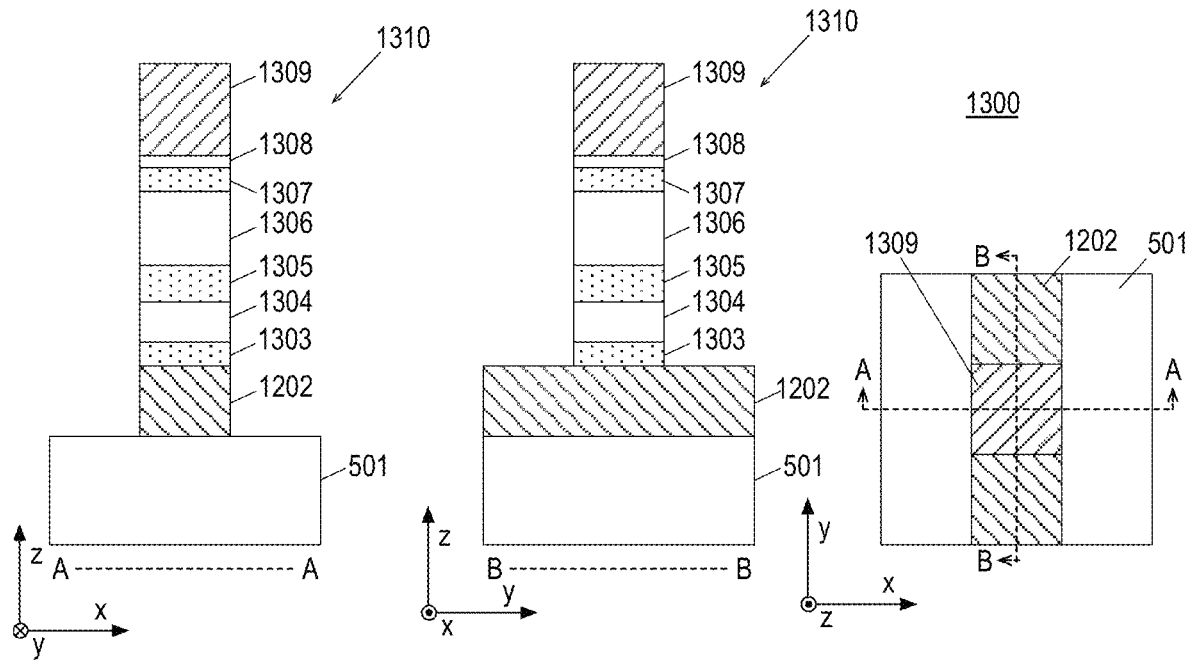

FIG. 13 is an illustration of an example phase change memory structure 1300 similar to phase change memory structure 1200 after patterning the phase change memory material layers to form any number of pillars of material layers while leaving bottom contact material layer 1202 unpatterned. The patterning may be provided using any suitable technique or techniques such as lithography and etch operations. Although illustrated with respect to separate cross-cut lithography etch, in some embodiments, the lithography and etch operations may be merged. As shown, the resultant patterned top contact material layer 1309, lamella layer 1308, top electrode material layer 1307, phase change material layer 1306, middle electrode material layer 1305, switching device material layer 1304, and bottom electrode material layer 1303 provide a pillar 1310 of any number of pillars of memory cells. In the illustrated embodiment, bottom contact material layer 1202 is not patterned again as it provides an access line as previously patterned. In other embodiments, bottom contact material layer 1202 is also patterned and forms part of pillar 1310.

FIG. 14 is an illustration of an example phase change memory structure 1400 similar to phase change memory structure 1400 after the formation of a conformal metal oxide liner 1401. Conformal liner 1401 may include any materials discussed with respect to liner 109 or multilayer liner 201 and, although illustrated with respect to a single material layer, conformal liner 901 may include multiple material layers. Conformal liner 1401 is formed via low temperature thermal ALD at any temperature or within any temperature range discussed herein. Liner 1401 may have any suitable thickness such as a thickness of not more than 8 nm.

Figure 15:
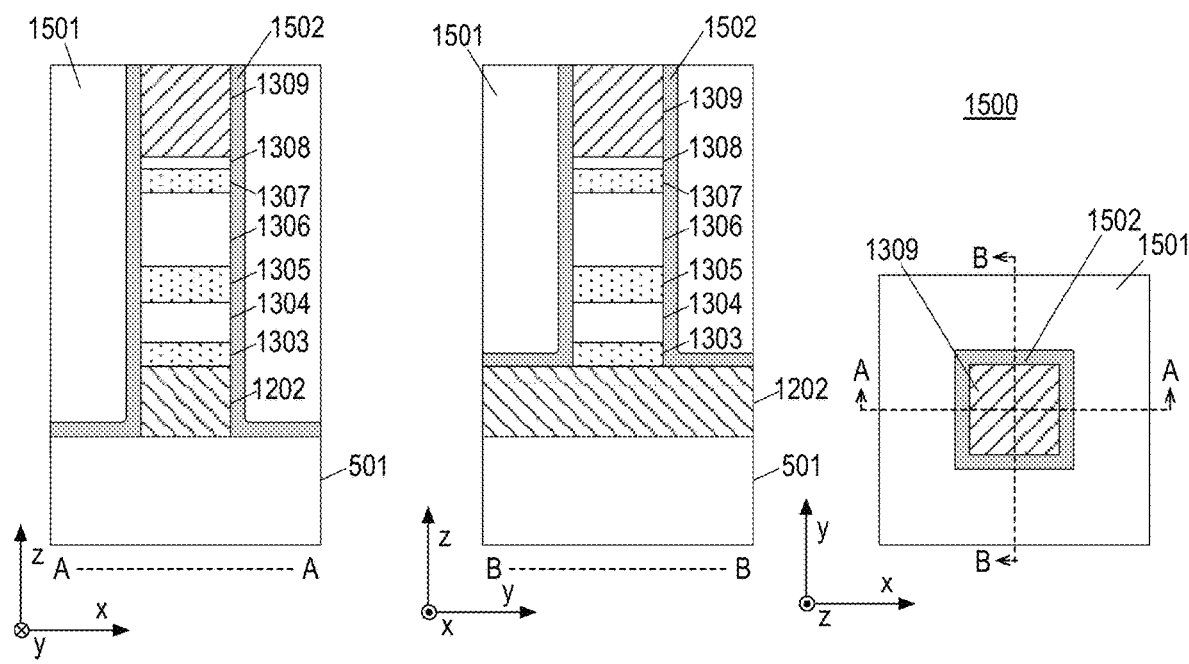

FIG. 15 is an illustration of an example phase change memory structure 1500 similar to phase change memory structure 1400 after the formation of a bulk dielectric material and a planar operation to form dielectric material

1501 and metal oxide liner 1502. In some embodiments, a bulk dielectric material is deposited via ALD, CVD, or the like to provide a dielectric fill between pillars 1310 (please refer to FIG. 14). The bulk dielectric fill may be followed by a planarization operation to expose top contact material layer 1309 and to remove the dielectric fill and portions of conformal metal oxide liner 1401 from the top of top contact material layer 1309 to form metal oxide liner 1502. Thereby, top contact material layer 702 is exposed for contact to an access line.

Figure 16:
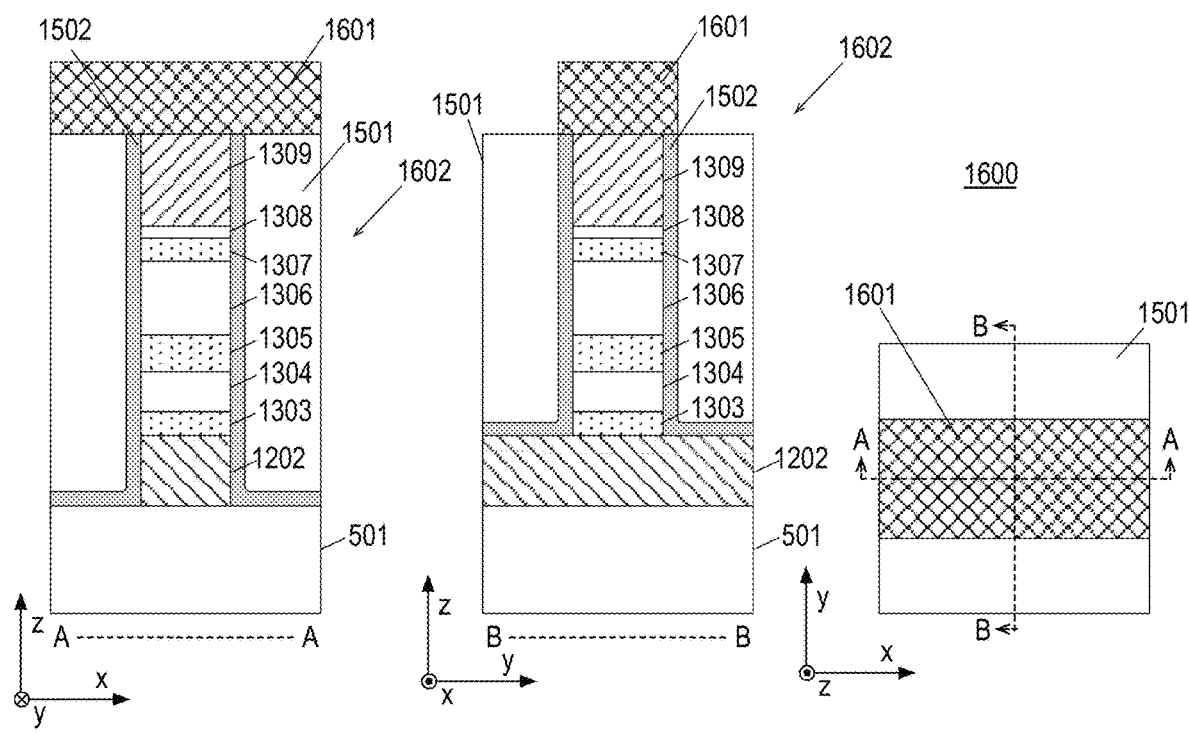

FIG. 16 is an illustration of an example phase change memory structure 1600 similar to phase change memory structure 1500 after the formation of an access line 1601 coupled to top contact material layer 1309 (or top contact). As discussed herein, access line 1601 (with bottom contact material layer 1202 as an access line or via an access line of substrate 501) provides access to memory cell 1602. Access line 1601 may be formed using any suitable technique or techniques such as deposition, lithography, and etch techniques. Access line 1601 may include any suitable conductive materials such as copper, aluminum, and tungsten. In some embodiments, access line 1601 is within and substantially planar (in the x-y plane) with a dielectric material adjacent to access line 1601 such that a surface is provided for subsequent layers of memory cells. That is, access line 1601 may also provide an access line for memory cells built in the z-direction. For example, the discussed techniques, or similar, may be used to generate any number of layers of memory cells and access lines.

Figure 17:
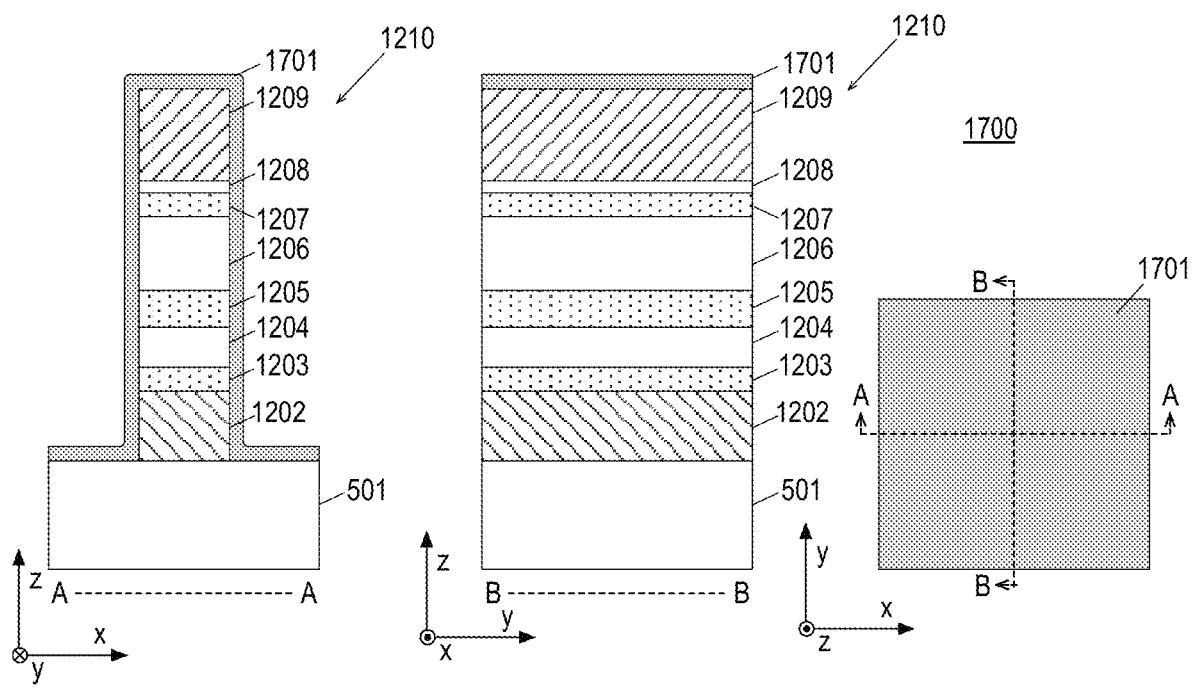

Turning now to techniques where a metal oxide liner is formed after both cuts of the bulk phase change memory material layers, FIG. 17 is an illustration of an example phase change memory structure 1700 similar to phase change memory structure 1200 (please refer to FIG. 12) after the formation of a conformal metal oxide liner 1701. Conformal liner 1701 may include any materials discussed with respect to liner 109 or multilayer liner 201. Conformal liner 1701 is formed via low temperature thermal ALD at any temperature or within any temperature range discussed herein. Liner 1701 may have any suitable thickness such as a thickness of not more than 8 nm. In some embodiments, liner 1701 has a thickness of not more than 4 nm. Notably, disposing a first metal oxide liner after forming rows 1201 of phase change memory material layers provides further protection during later processing inclusive of forming pillars of phase change memory material layers. In the following, such two-liner deposition techniques are illustrated with respect to examples where a bottom contact layer provides a first access line and a second access line is formed over the top contact. However, such techniques may be applied in contexts where both top and bottom contacts are coupled to top and bottom access lines or examples where the top and bottom contact layers provide the access lines.

Figure 18:
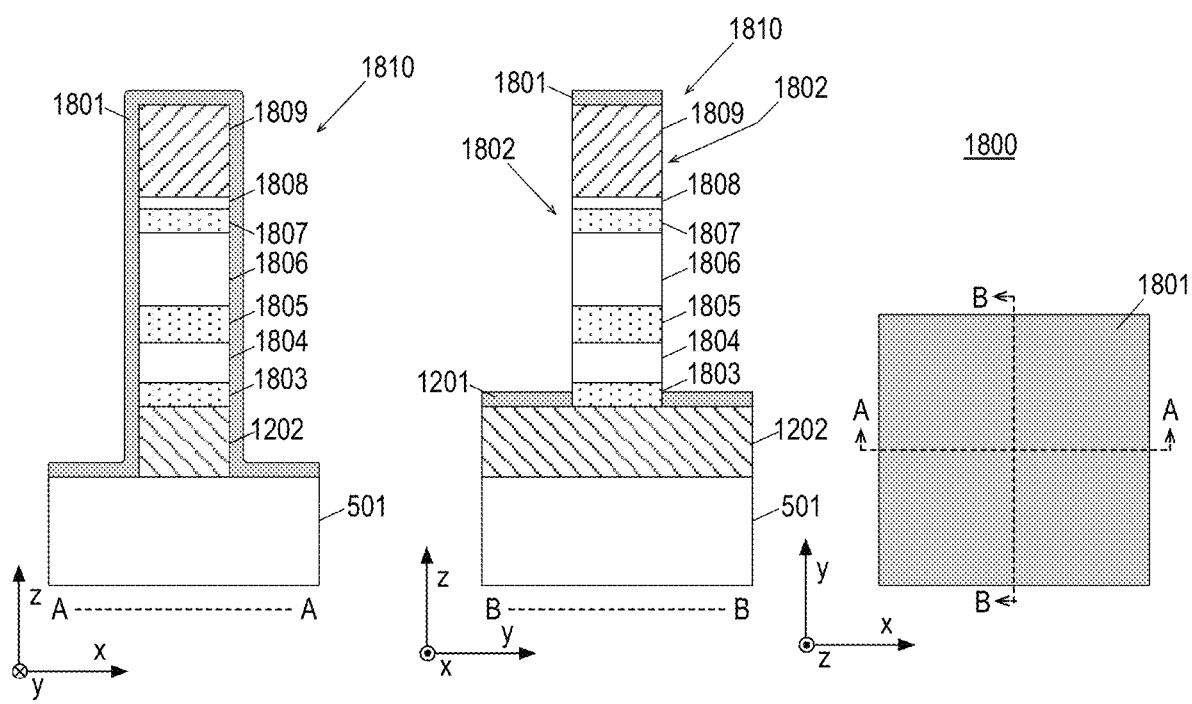

FIG. 18 is an illustration of an example phase change memory structure 1800 similar to phase change memory structure 1700 after patterning the phase change memory material layers to form any number of pillars of material layers while leaving bottom contact material layer 1202 unpatterned. The patterning may be provided using any suitable technique or techniques such as lithography and etch operations. As shown, the resultant patterned metal oxide layer 1801 leaves two sidewalls 1802 exposed. Furthermore, patterned top contact material layer 1809, lamella layer 1808, top electrode material layer 1807, phase change material layer 1806, middle electrode material layer 1805, switching device material layer 1804, and bottom electrode material layer 1803 provide a pillar 1810 of any number of pillars of memory cells. As in the example of FIG. 12, bottom contact material layer 1202 is not patterned again as it provides an access line as previously patterned. In other embodiments, bottom contact material layer 1202 is also patterned and forms part of pillar 1310.

Figure 19:
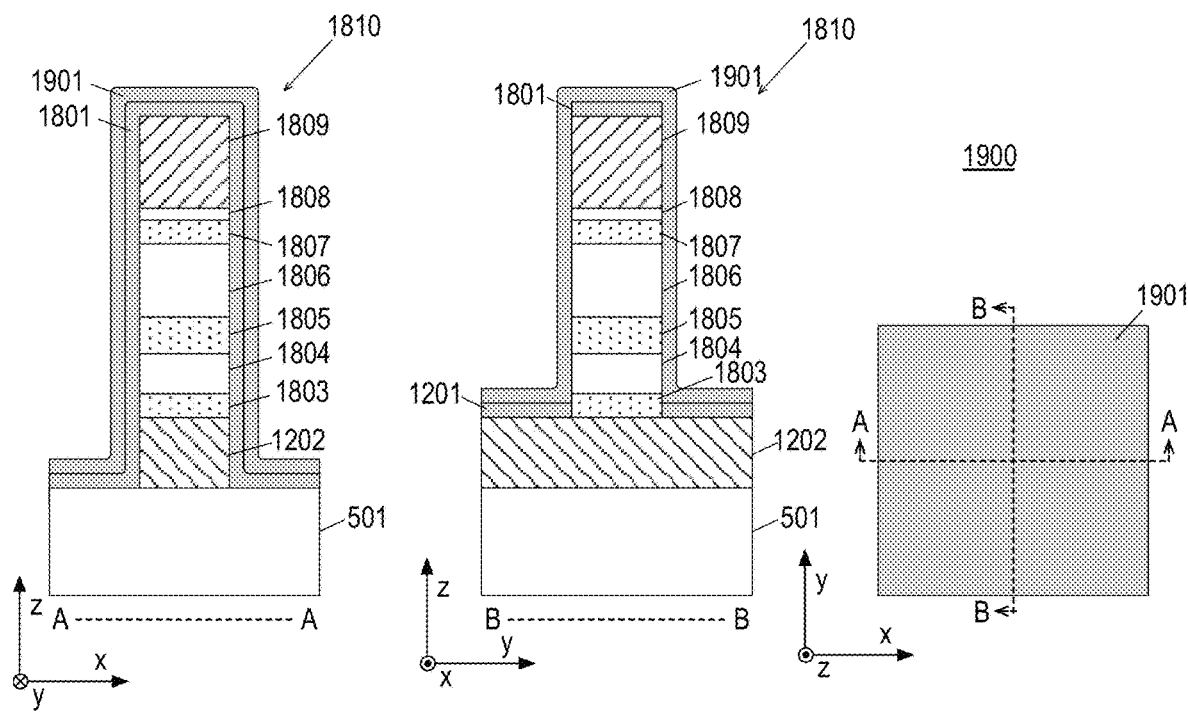

FIG. 19 is an illustration of an example phase change memory structure 1900 similar to phase change memory structure 1800 (after the formation of a conformal metal oxide liner 1901. Conformal liner 1901 may include any materials discussed with respect to liner 109 or multilayer liner 201. Conformal liner 1901 is formed via low temperature thermal ALD at any temperature or within any temperature range discussed herein. Liner 1901 may have any suitable thickness such as a thickness of not more than 8 nm. In some embodiments, liner 1901 has a thickness of not more than 4 nm. Notably, disposing a second metal oxide liner 1901 after forming pillars 1810 of phase change memory material layers provides further protection during later processing.

Figure 20:
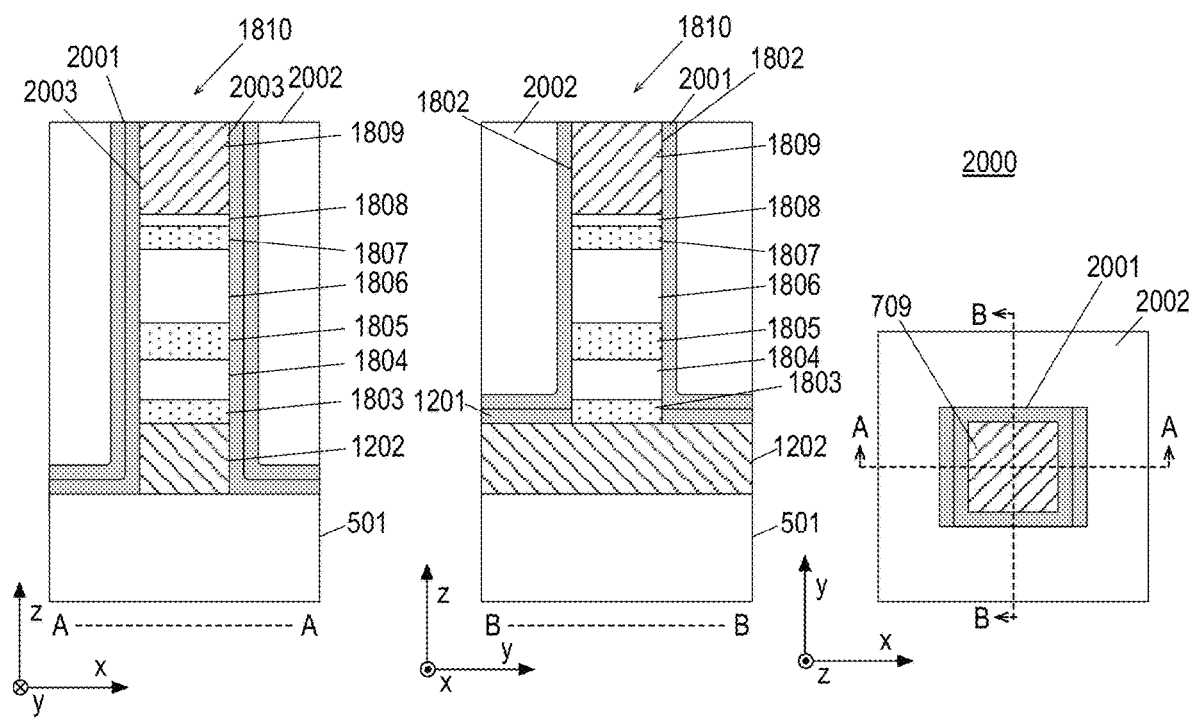

FIG. 20 is an illustration of an example phase change memory structure 2000 similar to phase change memory structure 1900 after the formation of a bulk dielectric material and a planar operation to form dielectric material 2002 and metal oxide liner 2001. In some embodiments, a bulk dielectric material is deposited via ALD, CVD, or the like to provide a dielectric fill and the bulk dielectric fill is planarized to expose top contact material layer 1809 and to remove the dielectric fill and portions of conformal metal oxide liners 1801, 1901 from the top of top contact material layer 1309 to form metal oxide liner 2001. Notably, sidewalls 1802 (i.e., sidewalls extending in the x-z plane) may have a single thickness or layer of liner material and sidewalls 2003 (i.e., sidewalls extending in the y-z plane) have two thicknesses or layers of liner material. Such thicknesses may be of the same single material or thicknesses of laminate materials. In some embodiments, a thickness of liner 2001 on sidewalls 2003 is about twice a thickness of liner 2001 on sidewalls 1802. In some embodiments, liner 2001 has a first thickness on sidewalls 1802 and a second thickness on sidewalls 2003 such that the first thickness is not more than 60% of the second thickness.

Figure 21:
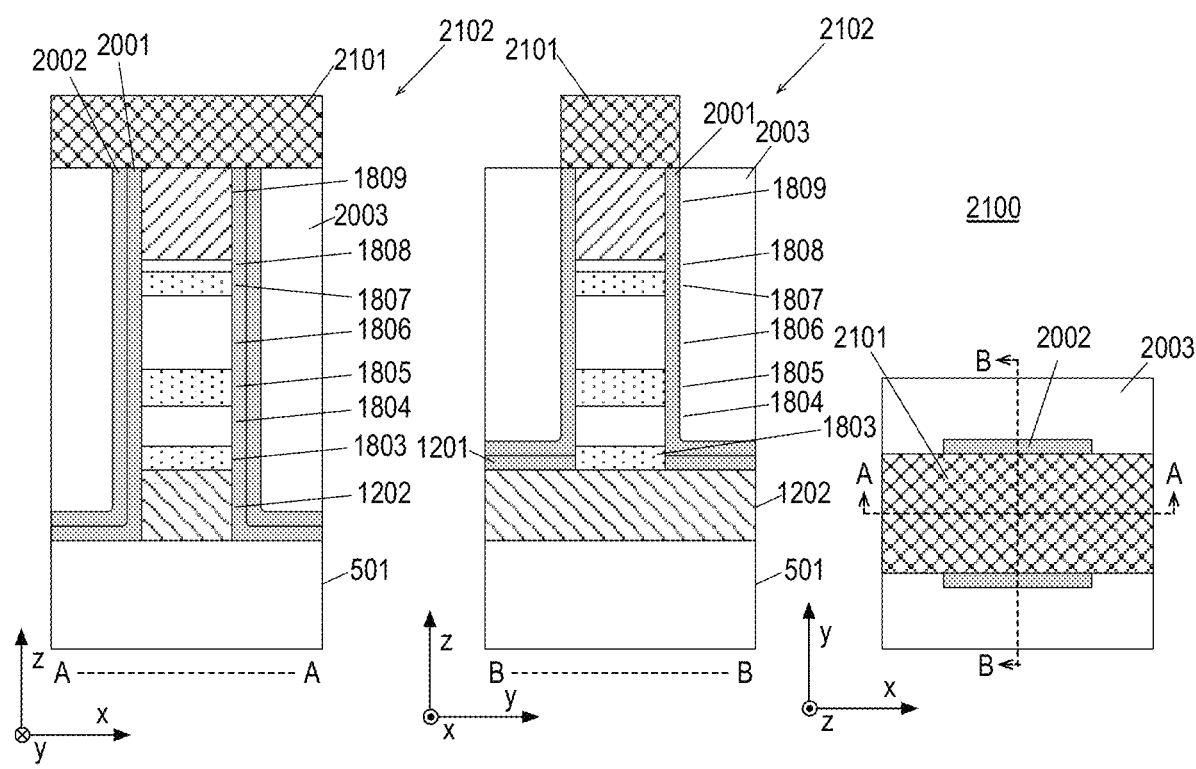

FIG. 21 is an illustration of an example phase change memory structure 2100 similar to phase change memory structure 2000 after the formation of an access line 2101 coupled to top contact material layer 1809 (or top contact). Access line 2101 and bottom contact material layer 1202 as an access line or via an access line of substrate 501 coupled to bottom contact material layer 1202 provides access to memory cell 2102. Access line 2101 may be formed using any suitable technique or techniques such as deposition, lithography, and etch techniques and access line 2101 may include any suitable conductive materials such as copper, aluminum, and tungsten. In some embodiments, access line 2101 is within and substantially planar (in the x-y plane) with a dielectric material adjacent to access line 2101 such that a surface is provided for subsequent layers of memory cells. For example, access line 2101 may provide an access line for memory cells built in the z-direction over the planar surface using the discussed techniques or similar techniques.

Figure 22:
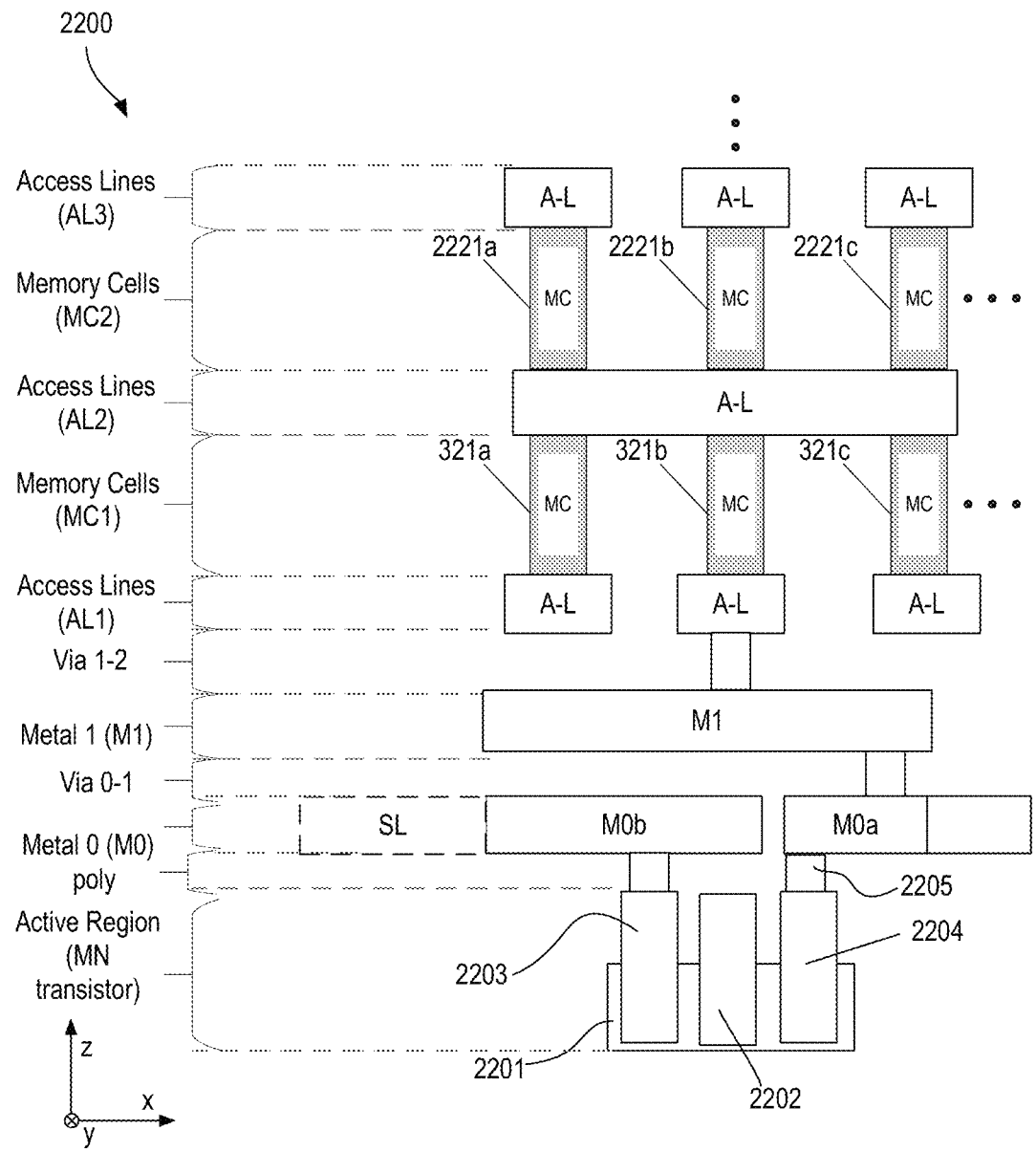
FIG. 22 is an illustration of an example cross-sectional die layout including example memory cells having phase change memory structures with metal oxide liners.

FIG. 22 is an illustration of an example cross-sectional die layout 2200 including example memory cells 321, 2221 having phase change memory structures with metal oxide liners, arranged in accordance with at least some implementations of the present disclosure. As discussed, memory cells 321 (inclusive of memory cells 321a, 321b, 321c, and so on) may include or implement may include phase change memory structure 100, phase change memory structure 200, or any other phase change memory structures discussed herein. In the same manner, memory cells 2221 (inclusive of memory cells 2221*a*, 2221*b*, 2221*c*, and so on) may include or implement may include phase change memory structure 100, phase change memory structure 200, or any other phase change memory structures discussed herein. As shown, die layout 2200 provides a 3D cross point (3DXP) architecture such that memory cells 321, memory cells 2221, are at intersections of orthogonal access lines.

Furthermore, as shown in FIG. 22, die layout 2200 illustrates an active region having a transistor including diffusion region 2201, a gate terminal 2202, a drain terminal 2204, and a source terminal 2203. For example, the transistor includes a gate terminal 2202, a drain terminal 2204, and a source terminal 2203 such that the transistor is a three terminal transistor. As shown, source terminal 2203 is coupled to a SL (source line) via poly or via, where the SL is formed in metal 0 (M0). In some embodiments, drain terminal 2204 is coupled to M0*a* (also in metal 0) through a via 2205. Drain terminal 2204 or source terminal 2203 may be coupled memory cells 321 and memory cells 2221 through via 0-1 (e.g., a via layer that connects metal 0 to metal 1 layers), metal 1 (M1), via 1-2 (e.g., a via layer that connects metal 1 to metal 2 layers), and selected ones of access lines 1 (AL1).

As discussed with respect to FIG. 3, memory cells 321 are coupled pertinent ones of access lines 1 and access lines 2 (AL2) to be selected via memory controller circuitry as implemented by transistors and other circuitry of the active region. Other transistors and interconnect structures are coupled to selected ones of access lines 1 and access lines 2 using vias, for example, implemented in the same plane as memory cells 321. Similarly, memory cells 2221 are coupled pertinent ones of access lines 2 and access lines 3 (AL3) to be selected via the memory controller circuitry, which are also connected to selected ones of access lines 2 and access line 3 using the discussed metallization layers and vias implemented in the same plane as memory cells 2221.

Die layout 2200 provides circuitry for access to and control of memory cells 321, 2221. Although illustrated with respect to two levels of memory cells, any number of levels may be implemented. Die layout 2200 is compact and thereby provides a high density memory circuit. The circuitry illustrated with respect to die layout 2200 may be employed in any integrated circuit device including dedicated memory devices or as integrated memory in a processor.

Figure 23:
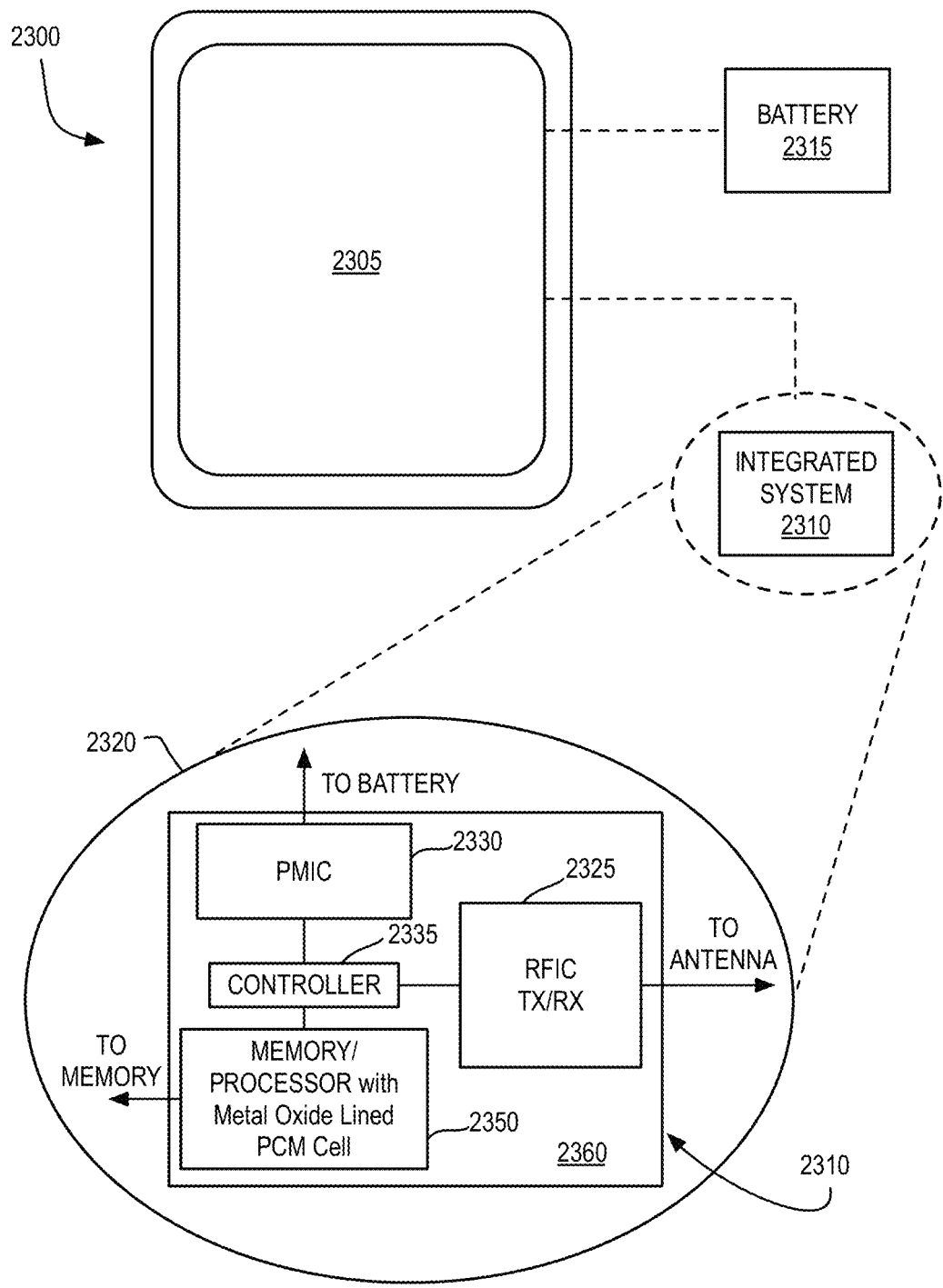
FIG. 23 is an illustrative diagram of a mobile computing platform employing a phase change material memory device having a metal oxide liner.

FIG. 23 is an illustrative diagram of a mobile computing platform 2300 employing a phase change material memory device having a metal oxide liner, arranged in accordance with at least some implementations of the present disclosure. Any die or device having a phase change material memory device with a metal oxide liner such as phase change memory structures 100, 200 inclusive of any characteristics discussed herein may be implemented by any component of mobile computing platform 2300. Mobile computing platform 2300 may be any portable device configured for each of electronic data display, electronic data processing, wireless electronic data transmission, or the like. For example, mobile computing platform 2300 may be any of a tablet, a smart phone, a netbook, a laptop computer, etc. and may include a display screen 2305, which in the exemplary embodiment is a touchscreen (e.g., capacitive, inductive, resistive, etc. touchscreen), a chip-level (SoC) or package-level integrated system 2310, and a battery 2315. Battery 2315 may include any suitable device for providing electrical power such as a device consisting of one or more electrochemical cells and electrodes to couple to an outside device. Mobile computing platform 2300 may further include a power supply to convert a source power from a source voltage to one or more voltages employed by other devices of mobile computing platform 2300.

Integrated system 2310 is further illustrated in the expanded view 2320. In the exemplary embodiment, packaged device 2350 (labeled "Memory/Processor" in FIG. 23) includes at least one memory chip (e.g., RAM), and/or at least one processor chip (e.g., a microprocessor, a multi-core microprocessor, or graphics processor, or the like). In an embodiment, the package device 2350 is a microprocessor including an SRAM cache memory. As shown, device 2350 may employ a die or device having any phase change memory structures and/or related characteristics discussed herein. Packaged device 2350 may be further coupled to (e.g., communicatively coupled to) a board, a substrate, or an interposer 2360 along with, one or more of a power management integrated circuit (PMIC) 2330, RF (wireless) integrated circuit (RFIC) 2325 including a wideband RF (wireless) transmitter and/or receiver (TX/RX) (e.g., including a digital baseband and an analog front end module further comprises a power amplifier on a transmit path and a low noise amplifier on a receive path), and a controller 2335 thereof. In general, packaged device 2350 may be also be coupled to (e.g., communicatively coupled to) display screen 2305. As shown, one or both of PMIC 2330 and RFIC 2325 may employ a die or device having any phase change memory structures and/or related characteristics discussed herein.

Functionally, PMIC 2330 may perform battery power regulation, DC-to-DC conversion, etc., and so has an input coupled to battery 2315 and with an output providing a current supply to other functional modules. In an embodiment, PMIC 2330 may perform high voltage operations. As further illustrated, in the exemplary embodiment, RFIC 2325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 2350 or within a single IC (SoC) coupled to the package substrate of the packaged device 2350.

Figure 24:
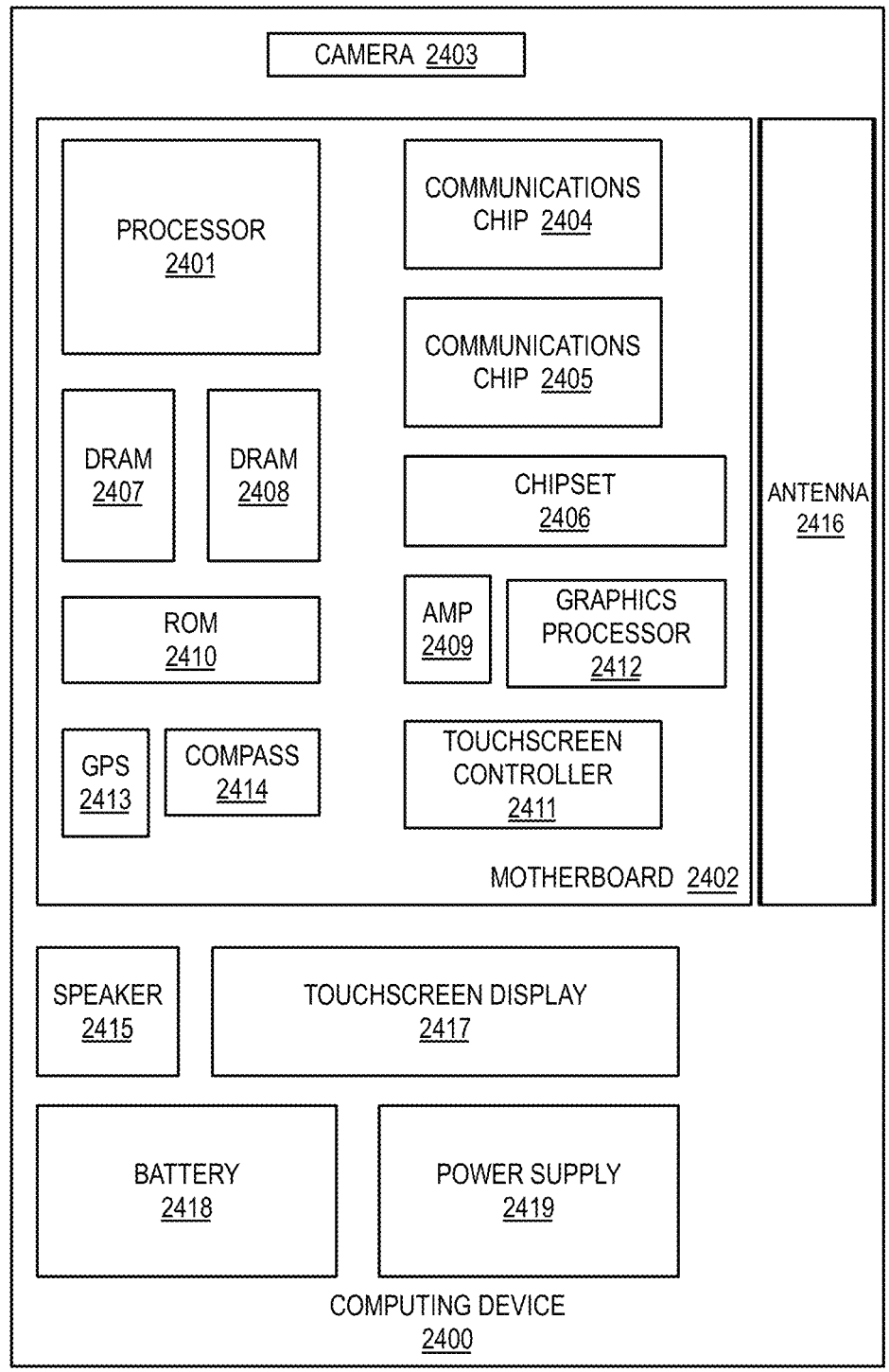
FIG. 24 is a functional block diagram of a computing device, all arranged in accordance with at least some implementations of the present disclosure.

FIG. 24 is a functional block diagram of a computing device 2400, arranged in accordance with at least some implementations of the present disclosure. Computing device 2400 may be found inside platform 2300, for example, and further includes a motherboard 2402 hosting a number of components, such as but not limited to a processor 2401 (e.g., an applications processor) and one or more communications chips 2404, 2405. Processor 2401 may be physically and/or electrically coupled to motherboard 2402. In some examples, processor 2401 includes an integrated circuit die packaged within the processor 2401. In general, the term "processor" may refer to any device or portion of a device that processes electronic data from registers and/or memory to transform that electronic data into other electronic data that may be stored in registers and/or memory. Any one or more device or component of computing device 2400 may include a die or device having any phase change memory structures and/or related characteristics discussed herein as discussed herein.

In various examples, one or more communication chips 2404, 2405 may also be physically and/or electrically coupled to the motherboard 2402. In further implementations, communication chips 2404 may be part of processor 2401. Depending on its applications, computing device 2400 may include other components that may or may not be physically and electrically coupled to motherboard 2402. These other components may include, but are not limited to, volatile memory (e.g., DRAM) 2407, 2408, non-volatile memory (e.g., ROM) 2410, a graphics processor 2412, flash memory, global positioning system (GPS) device 2413, compass 2414, a chipset 2406, an antenna 2416, a power amplifier 2409, a touchscreen controller 2411, a touchscreen display 2417, a speaker 2415, a camera 2403, a battery 2418, and a power supply 2419, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 2404, 2405 may enable wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2404, 2405 may implement any of a number of wireless standards or protocols, including but not limited to those described elsewhere herein. As discussed, computing device 2400 may include a plurality of communication chips 2404, 2405. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 2419 may convert a source power from a source voltage to one or more voltages employed by other devices of mobile computing platform 2300. In some embodiments, power supply 2419 converts an AC power to DC power. In some embodiments, power supply 2419 converts an DC power to DC power at one or more different (lower) voltages. In some embodiments, multiple power supplies are staged to convert from AC to DC and then from DC at a higher voltage to DC at a lower voltage as specified by components of computing device 2400.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, phase change memory structure comprises a memory cell material stack coupled to and between first and second electrodes, the memory cell material stack comprising at least a phase change material layer and a switching device and a liner on one or more sidewalls of the memory cell material stack, the liner comprising lanthanum and oxygen or hafnium, silicon, and oxygen.

In one or more second embodiments, further to the first embodiments, the liner comprises a first material layer on the one or more sidewalls and a second material layer on the first material layer, the first material layer comprising lanthanum oxide and the second material layer comprising one of aluminum oxide or hafnium oxide.

In one or more third embodiments, further to the first or second embodiments, the second material layer comprises aluminum oxide, the liner further comprising a third material layer on the second material layer, the third material layer comprising one of lanthanum oxide or hafnium oxide.

In one or more fourth embodiments, further to any of the first through third embodiments, the liner comprises a first material layer on the one or more sidewalls and a second material layer on the first material layer, the first material layer comprising hafnium silicate and the second material layer comprising one of aluminum oxide or hafnium oxide.

In one or more fifth embodiments, further to any of the first through fourth embodiments, the second material layer comprises aluminum oxide, the liner further comprising a third material layer on the second material layer, the third material layer comprising one of hafnium silicate or hafnium oxide.

In one or more sixth embodiments, further to any of the first through fifth embodiments, the liner comprises polycrystalline lanthanum oxide.

In one or more seventh embodiments, further to any of the first through sixth embodiments, the liner has a thickness of not more than 80 nm on the one or more sidewalls and the memory cell material stack has a height to width aspect ratio of not less than seven to one.

In one or more eighth embodiments, further to any of the first through seventh embodiments, the liner has a first thickness on a first sidewall of the memory cell material stack and a second thickness on a second sidewall of the memory cell material stack, the first thickness not more than 60% of the second thickness.

In one or more ninth embodiments, further to any of the first through eighth embodiments, the memory cell material stack comprises a first layer, the switching device over the first layer, a second layer over the switching device, the phase change material layer over the second layer, and a third layer over the phase change material layer, wherein the first layer, the second layer and the third layer each comprise carbon.

In one or more tenth embodiments, further to any of the first through ninth embodiments, the switching device comprises a first chalcogenide material and the phase change material layer comprises a second chalcogenide material.

In one or more eleventh embodiments, a system comprises a power supply and a phase change memory structure according to any of the first through tenth embodiments coupled to the power supply.

In one or more twelfth embodiments, a system comprises a power supply, an integrated memory circuit coupled to the power supply, the integrated memory circuit comprising a first access line, a second access line, and a memory cell coupled to the first and second access lines, the memory cell comprising a phase change material layer and a switching device separated by an electrode layer, and a liner on a sidewall of each of the phase change material layer, the electrode layer, and the switching device, the liner comprising lanthanum and oxygen or hafnium, silicon, and oxygen.

In one or more thirteenth embodiments, further to the twelfth embodiments, the liner comprises a first material layer on the sidewalls and a second material layer on the first material layer, the first material layer comprising lanthanum oxide and the second material layer comprising one of aluminum oxide or hafnium oxide.

In one or more fourteenth embodiments, further to the twelfth or thirteenth embodiments, the second material layer comprises aluminum oxide, the liner further comprising a third material layer on the second material layer, the third material layer comprising one of lanthanum oxide or hafnium oxide.

In one or more fifteenth embodiments, further to any of the twelfth through fourteenth embodiments, the liner comprises a first material layer on the one or more sidewalls and a second material layer on the first material layer, the first material layer comprising hafnium silicate and the second material layer comprising one of aluminum oxide or hafnium oxide.

In one or more sixteenth embodiments, further to any of the twelfth through fifteenth embodiments, the second material layer comprises aluminum oxide, the liner further comprising a third material layer on the second material layer, the third material layer comprising one of hafnium silicate or hafnium oxide.

In one or more seventeenth embodiments, further to any of the twelfth through sixteenth embodiments, the liner comprises polycrystalline lanthanum oxide having a thickness of not more than 8 nm and the integrated memory circuit further comprises a bulk insulator adjacent the liner.

In one or more eighteenth embodiments, a method of forming an integrated circuit structure comprises forming a plurality of memory cell material layers over a substrate, the memory cell material layers comprising at least a phase change material layer and a switching layer, patterning the memory cell material layers to form a memory cell material stack pillar, and depositing, via thermal atomic layer deposition, a liner on one or more sidewalls of the memory cell material stack pillar, the liner comprising lanthanum and oxygen or hafnium, silicon, and oxygen.

In one or more nineteenth embodiments, further to the eighteenth embodiments, depositing the liner comprises depositing a first material layer of lanthanum oxide followed by a second material layer of comprising one of aluminum oxide or hafnium oxide.

In one or more twentieth embodiments, further to the eighteenth or nineteenth embodiments, depositing the liner comprises depositing a first material layer of hafnium silicate followed by a second material layer of comprising one of aluminum oxide or hafnium oxide.

In one or more twenty-first embodiments, further to any of the eighteenth through twentieth embodiments, patterning the memory cell material layers and depositing the liner comprises patterning the memory cell material layers to form memory cell material stack rows, depositing a first layer of the liner over the memory cell material stack rows, patterning the memory cell material layer rows to form the memory cell material stack pillar, and depositing a second layer of the liner over the memory cell material stack pillar, wherein the liner has a first thickness on a first sidewall of the memory cell material stack pillar and a second thickness on a second sidewall of the memory cell material stack pillar, the first thickness not more than 60% of the second thickness.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A phase change memory structure, comprising
   a memory cell material stack coupled to and between first and second electrodes, the memory cell material stack comprising at least a phase change material layer and a switching device; and
   a liner on one or more sidewalls of the memory cell material stack, the liner comprising a first material layer on the one or more sidewalls and a second material layer on the first material layer, the first material layer comprising lanthanum and oxygen, and the second material layer comprising oxygen and aluminum or hafnium.

2. The phase change memory structure of claim 1, wherein the second material layer comprises oxygen and aluminum, the liner further comprising a third material layer on the second material layer, the third material layer comprising oxygen and lanthanum or hafnium.

3. The phase change memory structure of claim 1, wherein the first material layer comprises polycrystalline lanthanum oxide.

4. The phase change memory structure of claim 1, wherein the liner has a thickness of not more than 80 nm on the one or more sidewalls and the memory cell material stack has a height to width aspect ratio of not less than seven to one.

5. The phase change memory structure of claim 1, wherein the liner has a first thickness on a first sidewall of the memory cell material stack and a second thickness on a second sidewall of the memory cell material stack, the first thickness not more than 60% of the second thickness.

6. The phase change memory structure of claim 1, wherein the memory cell material stack comprises a first layer, the switching device over the first layer, a second layer over the switching device, the phase change material layer over the second layer, and a third layer over the phase change material layer, wherein the first layer, the second layer and the third layer each comprise carbon.

7. The phase change memory structure of claim 6, wherein the switching device comprises a first chalcogenide material and the phase change material layer comprises a second chalcogenide material.

8. The phase change memory structure of claim 1, further comprising:
   a power supply;
   an integrated memory circuit coupled to the power supply, the integrated memory circuit comprising a first access line, a second access line, and a memory cell coupled to the first and second access lines, the memory cell comprising the memory cell material stack and the liner.

9. A phase change memory structure, comprising
   a memory cell material stack coupled to and between first and second electrodes, the memory cell material stack comprising at least a phase change material layer and a switching device; and a liner on one or more sidewalls of the memory cell material stack, the liner comprising a first material layer on the one or more sidewalls and a second material layer on the first material layer, the first material layer comprising hafnium, silicon, and oxygen, and the second material layer comprising oxygen and aluminum or hafnium.

10. The phase change memory structure of claim 9, wherein the second material layer comprises oxygen and aluminum, the liner further comprising a third material layer on the second material layer, the third material layer comprising hafnium and oxygen, or hafnium, silicon, and oxygen.

11. The phase change memory structure of claim 9, wherein the liner has a thickness of not more than 80 nm on the one or more sidewalls and the memory cell material stack has a height to width aspect ratio of not less than seven to one.

12. The phase change memory structure of claim 9, wherein the liner has a first thickness on a first sidewall of the memory cell material stack and a second thickness on a second sidewall of the memory cell material stack, the first thickness not more than 60% of the second thickness.

13. The phase change memory structure of claim 9, wherein the memory cell material stack comprises a first layer, the switching device over the first layer, a second layer over the switching device, the phase change material layer over the second layer, and a third layer over the phase change material layer, wherein the first layer, the second layer and the third layer each comprise carbon.

14. The phase change memory structure of claim 13, wherein the switching device comprises a first chalcogenide material and the phase change material layer comprises a second chalcogenide material.

15. The phase change memory structure of claim 9, further comprising:
a power supply;
an integrated memory circuit coupled to the power supply, the integrated memory circuit comprising a first access line, a second access line, and a memory cell coupled to the first and second access lines, the memory cell comprising the memory cell material stack and the liner.

16. A phase change memory structure, comprising
a memory cell material stack coupled to and between first and second electrodes, the memory cell material stack comprising a phase change material layer and a switching device material layer; and
a multilayer liner on sidewalls of the phase change material layer and the switching device material layer, the multilayer liner comprising a layer of hafnium silicate or lanthanum oxide on the sidewalls of the phase change material layer and the switching device material layer and a layer of hafnium oxide or aluminum oxide on the layer of hafnium silicate or lanthanum oxide.

17. The phase change memory structure of claim 16, wherein the layer of hafnium silicate or lanthanum oxide on the sidewalls of the phase change material layer is lanthanum oxide, the layer of hafnium oxide or aluminum oxide is aluminum oxide, and multilayer liner further comprises a layer of lanthanum oxide or hafnium oxide on the layer of aluminum oxide.

18. The phase change memory structure of claim 16, wherein the layer of hafnium silicate or lanthanum oxide on the sidewalls of the phase change material layer is hafnium silicate, the layer of hafnium oxide or aluminum oxide is aluminum oxide, and multilayer liner further comprises a layer of hafnium silicate or hafnium oxide on the layer of aluminum oxide.

19. The phase change memory structure of claim 16, wherein the memory cell material stack comprises a first layer, the switching device material layer over the first layer, a second layer over the switching device material layer, the phase change material layer over the second layer, and a third layer over the phase change material layer, wherein the first layer, the second layer and the third layer each comprise carbon.

20. The phase change memory structure of claim 16, further comprising:
a power supply;
an integrated memory circuit coupled to the power supply, the integrated memory circuit comprising a first access line, a second access line, and a memory cell coupled to the first and second access lines, the memory cell comprising the memory cell material stack and the multilayer liner.

* * * * *